United States Patent
Chang et al.

(10) Patent No.: US 10,866,292 B2
(45) Date of Patent: *Dec. 15, 2020

(54) METHODS AND SYSTEMS FOR COIL SELECTION IN MAGNETIC RESONANCE IMAGING

(71) Applicant: General Electric Company, Schenectady, NY (US)

(72) Inventors: Shaorong Chang, Hartland, WI (US); Dashen Chu, Hartland, WI (US); Charles Michelich, Brookfield, WI (US); Anja Kammeier, Milwaukee, WI (US); Dawei Gui, Sussex, WI (US); Zachary Slavens, New Berlin, WI (US); Brent Robinson, Madison, WI (US); Ling Sun, Brookfield, WI (US)

(73) Assignee: GENERAL ELECTRIC COMPANY, Schenectady, NY (US)

(*) Notice: Subject to any disclaimer, the term of this patent is extended or adjusted under 35 U.S.C. 154(b) by 237 days.

This patent is subject to a terminal disclaimer.

(21) Appl. No.: 15/995,012

(22) Filed: May 31, 2018

(65) Prior Publication Data

US 2019/0369179 A1 Dec. 5, 2019

(51) Int. Cl.
*G01R 33/36* (2006.01)
*G01R 33/44* (2006.01)
(Continued)

(52) U.S. Cl.
CPC ..... *G01R 33/3664* (2013.01); *G01R 33/0023* (2013.01); *G01R 33/443* (2013.01); *G01R 33/58* (2013.01); *G01R 33/0005* (2013.01)

(58) Field of Classification Search
CPC .. G01R 33/58; G01R 33/443; G01R 33/0023; G01R 33/3664
See application file for complete search history.

(56) References Cited

U.S. PATENT DOCUMENTS 6,717,406 B2    4/2004  Sodickson
6,961,455 B2   11/2005  Ma et al.
(Continued)

FOREIGN PATENT DOCUMENTS

EP         2255214 B1      5/2017
WO      2009112987 A1      9/2009
(Continued)

OTHER PUBLICATIONS

Chang, S. et al., "Method and Systems for Coil Selection in Magnetic Resonance Imaging," U.S. Appl. No. 15/995,051, filed May 31, 2018, 67 pages.

(Continued)

*Primary Examiner* — Dixomara Vargas
(74) *Attorney, Agent, or Firm* — McCoy Russell LLP

(57) ABSTRACT

Various methods and systems are provided for selecting radio frequency (RF) coil array for magnetic resonance imaging (MRI). In one embodiment, the method comprises grouping the plurality of coil elements into receiving elements groups (REGs) according to REGs information, generating channel sensitivity maps for the plurality of coil elements, generating REG sensitivity maps based on the REGs information and the channel sensitivity maps, selecting one or more REGs based on the REG sensitivity maps and a region of interest (ROI), and scanning the ROI with the coil elements of the one or more selected REGs being activated and the coil elements not in any selected REGs being deactivated. In this way, coil arrays may be automatically selected for improved image quality of the MRI.

20 Claims, 12 Drawing Sheets

(51) Int. Cl.
*G01R 33/00* (2006.01)
*G01R 33/58* (2006.01)

(56) References Cited

U.S. PATENT DOCUMENTS

| | | | | |
|---|---|---|---|---|
| 7,800,368 | B2* | 9/2010 | Vaughan | G01R 33/5612 |
| | | | | 324/318 |
| 7,924,007 | B2 | 4/2011 | Arnold et al. | |
| 8,188,738 | B2* | 5/2012 | Hori | G01R 33/5611 |
| | | | | 324/318 |
| 8,488,860 | B2* | 7/2013 | Uchizono | G01R 33/561 |
| | | | | 382/131 |
| 8,502,535 | B2 | 8/2013 | Jurrissen et al. | |
| 8,934,694 | B2 | 1/2015 | Chen et al. | |
| 9,084,553 | B2 | 7/2015 | Warmuth | |
| 9,395,431 | B2 | 7/2016 | Detsky et al. | |
| 9,427,171 | B2 | 8/2016 | Gdaniec et al. | |
| 9,655,522 | B2 | 5/2017 | Li et al. | |
| 9,675,249 | B2 | 6/2017 | Miyazaki et al. | |
| 9,678,189 | B2 | 6/2017 | Mekkaoui | |
| 9,700,220 | B2 | 7/2017 | Miyazaki et al. | |
| 9,760,979 | B2 | 9/2017 | Chen et al. | |
| 9,835,705 | B2 | 12/2017 | Weingartner et al. | |
| 9,846,215 | B2 | 12/2017 | Hamada et al. | |
| 9,846,217 | B2 | 12/2017 | Lin | |
| 9,874,620 | B2 | 1/2018 | Ahmad et al. | |
| 9,886,745 | B2 | 2/2018 | Chen et al. | |
| 2003/0132750 | A1* | 7/2003 | Machida | G01R 33/3415 |
| | | | | 324/322 |
| 2005/0275402 | A1 | 12/2005 | Campagna | |
| 2006/0087320 | A1* | 4/2006 | Machida | G01R 33/3415 |
| | | | | 324/322 |
| 2006/0197633 | A1* | 9/2006 | Lee | G01R 33/34046 |
| | | | | 333/231 |
| 2007/0013375 | A1* | 1/2007 | Akao | G01R 33/5611 |
| | | | | 324/309 |
| 2007/0164742 | A1* | 7/2007 | Bito | G01R 33/34046 |
| | | | | 324/318 |
| 2007/0210793 | A1 | 9/2007 | Kiefer | |
| 2008/0129298 | A1* | 6/2008 | Vaughan | G01R 33/5612 |
| | | | | 324/322 |
| 2008/0211502 | A1 | 9/2008 | Arnold et al. | |
| 2008/0290870 | A1 | 11/2008 | Misic | |
| 2011/0006766 | A1 | 1/2011 | Jurrissen et al. | |
| 2011/0103668 | A1* | 5/2011 | Uchizono | G01R 33/561 |
| | | | | 382/131 |
| 2014/0002083 | A1 | 1/2014 | Asaba et al. | |
| 2014/0145717 | A1 | 5/2014 | Ozawa et al. | |
| 2014/0300355 | A1 | 10/2014 | Fautz et al. | |
| 2015/0247911 | A1 | 9/2015 | Iwadate | |
| 2015/0355303 | A1* | 12/2015 | Kuhara | G01R 33/5611 |
| | | | | 324/322 |
| 2016/0018489 | A1* | 1/2016 | Farivar-Mohseni | |
| | | | | G01R 33/34084 |
| | | | | 600/422 |
| 2016/0198970 | A1 | 7/2016 | Liu et al. | |
| 2016/0324427 | A1 | 11/2016 | Meyer et al. | |
| 2017/0049355 | A1 | 2/2017 | Furudate | |
| 2017/0089993 | A1 | 3/2017 | McKinnon et al. | |
| 2017/0273578 | A1 | 9/2017 | Finn et al. | |
| 2017/0328970 | A1 | 11/2017 | Bi et al. | |
| 2017/0350953 | A1 | 12/2017 | Huang et al. | |
| 2018/0059195 | A1 | 3/2018 | Lai et al. | |
| 2019/0369180 | A1* | 12/2019 | Chang | G01R 33/0005 |
| 2019/0369181 | A1* | 12/2019 | Chang | G01R 33/58 |
| 2019/0369198 | A1* | 12/2019 | Chang | G01R 33/3664 |

FOREIGN PATENT DOCUMENTS

| | | |
|---|---|---|
| WO | 2009112987 A8 | 9/2009 |
| WO | 2014084259 A1 | 6/2014 |

OTHER PUBLICATIONS

Chang, S. et al., "Method and Systems for Coil Selection in Magnetic Resonance Imaging to Reduce Annefact Artifact," U.S. Appl. No. 15/995,059, filed May 31, 2018, 54 pages.

Chang, S., "Method and Systems for Coil Selection in Magnetic Resonance Imaging to Reduce Phase Wrap Artifact," U.S. Appl. No. 15/995,023, filed May 31, 2018, 50 pages.

United States Patent and Trademark Office, Office Action Issued in U.S. Appl. No. 15/995,059, dated Mar. 30, 2020, 17 pages.

* cited by examiner

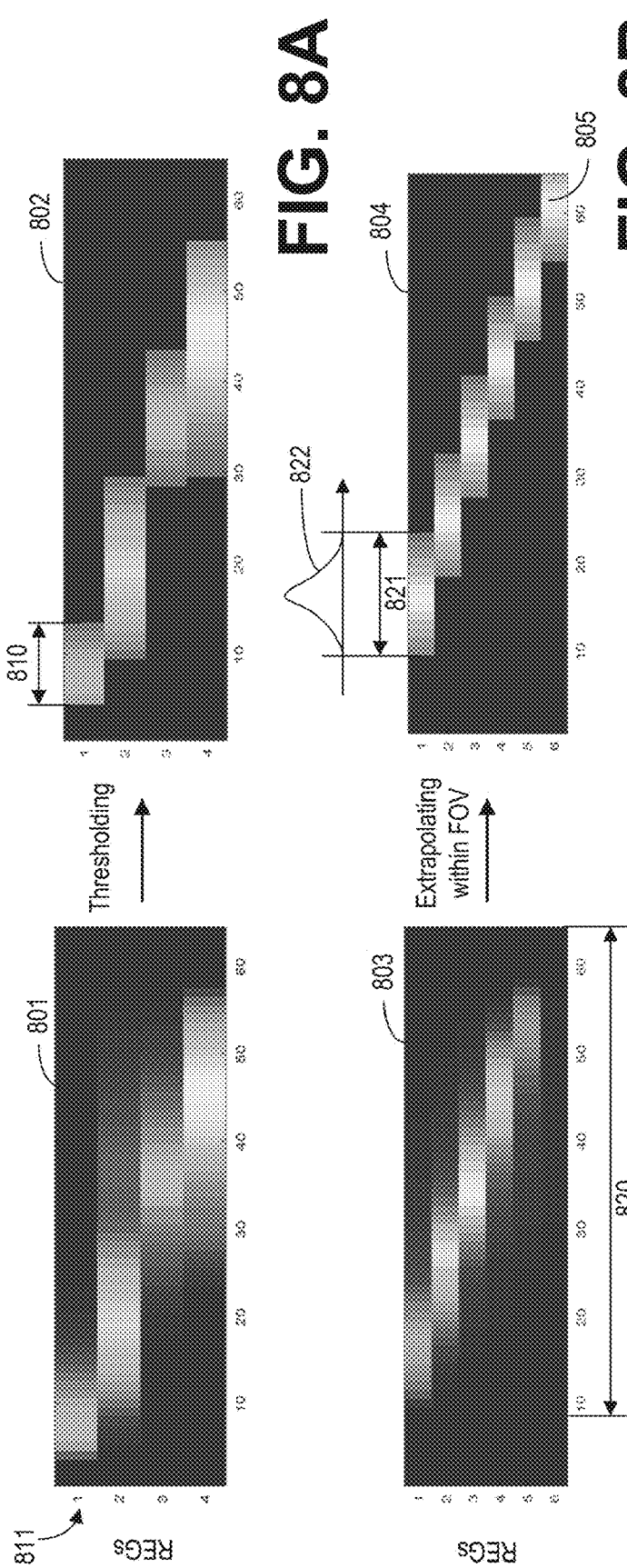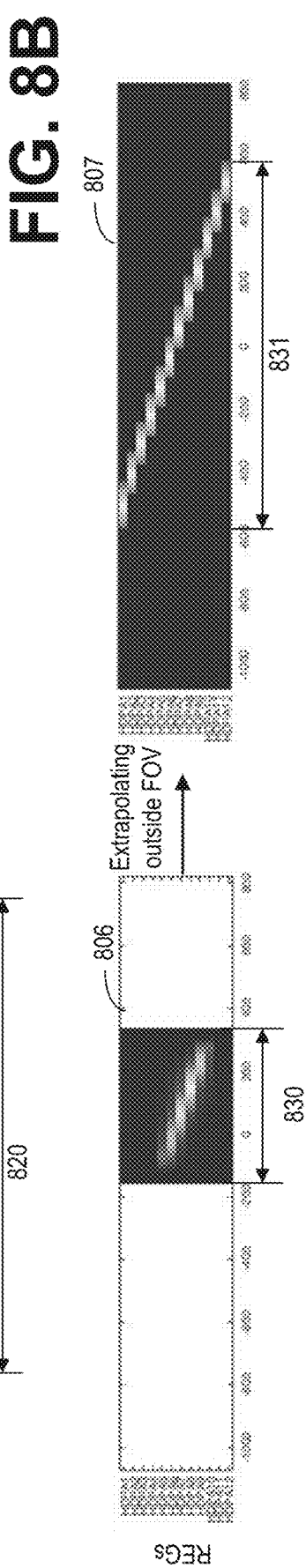

METHODS AND SYSTEMS FOR COIL SELECTION IN MAGNETIC RESONANCE IMAGING

FIELD

Embodiments of the subject matter disclosed herein relate to magnetic resonance imaging, and more particularly, to selecting radio-frequency (RF) coil arrays during magnetic resonance imaging.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field $B_0$. When the human body, or part of the human body, is placed in the magnetic field $B_0$, the nuclear spins associated with the hydrogen nuclei in tissue water become polarized, wherein the magnetic moments associated with these spins become preferentially aligned along the direction of the magnetic field $B_0$, resulting in a small net tissue magnetization along that axis. MRI systems also include gradient coils that produce smaller amplitude, spatially-varying magnetic fields with orthogonal axes to spatially encode the magnetic resonance (MR) signal by creating a signature resonance frequency at each location in the body. The hydrogen nuclei are excited by a radio frequency signal at or near the resonance frequency of the hydrogen nuclei, which add energy to the nuclear spin system. As the nuclear spins relax back to their rest energy state, they release the absorbed energy in the form of an RF signal. This RF signal (or MR signal) is detected by one or more RF coil arrays and is transformed into the image using a computer and known reconstruction algorithms.

In some examples, one or more of the RF coil arrays may be removable. For example, based on a given imaging objective, the operator can position a selected surface RF coil array over the imaging subject and plug the RF coil array into the MRI imaging apparatus. Further, some RF coil arrays may be deformable, stretchable, or otherwise may have varying shapes or positions relative to the imaging subject.

Each of the RF coil arrays may include one or more coil elements. Each coil element is electronically coupled to the MRI apparatus via a channel of a plurality of channels. The sensitivity of each coil element to the MR signal depends on the distance of the coil element from the source of the MR signal. As one or more of the RF coil arrays may be deformable, and the operator may position surface RF coil arrays differently for different imaging subjects and/or imaging objectives, coil elements having high sensitivity to the MR signal may change from scan to scan.

BRIEF DESCRIPTION

In one embodiment, a method for magnetic resonance imaging (MRI) with a receive radio frequency (RF) coil array including a plurality of coil elements includes grouping the plurality of coil elements into receiving elements groups (REGs) according to REGs information, generating channel sensitivity maps the plurality of coil elements, generating REG sensitivity maps based on the REGs information and the channel sensitivity maps, selecting one or more REGs based on the REG sensitivity maps and a region of interest (ROI), and scanning the ROI with the coil elements in the one or more selected REGs being activated and the coil elements not in any selected REGs being deactivated. In this way, the coil elements for receiving the MR signals may be automatically selected based on each coil element's sensitivity. As a result, quality of the reconstructed image is improved.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIGS. 8A-8C show examples for processing raw REG sensitivity maps.

DETAILED DESCRIPTION

Figure 1:
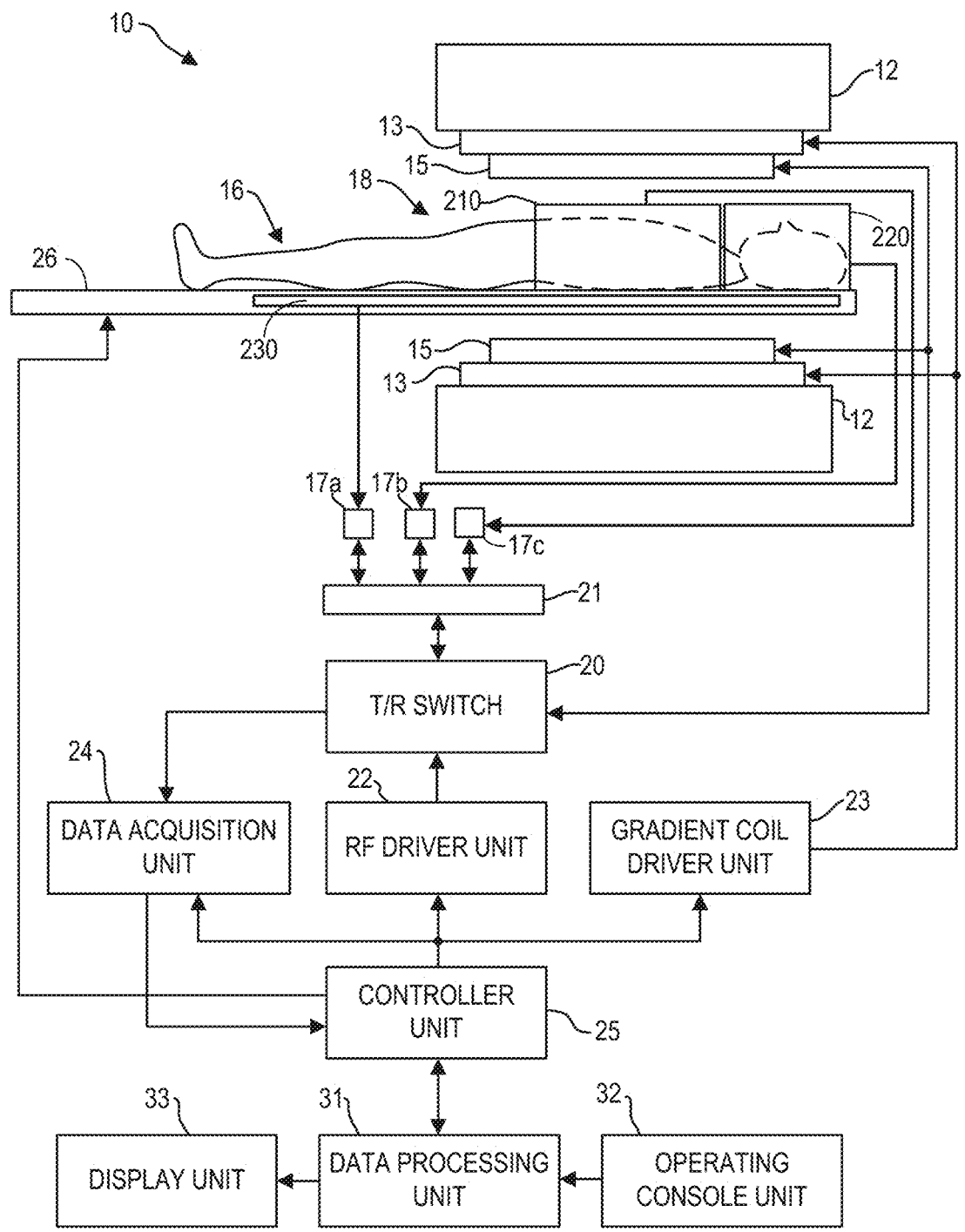
FIG. 1 is a block diagram of an MRI system according to an embodiment.
Figure 2:
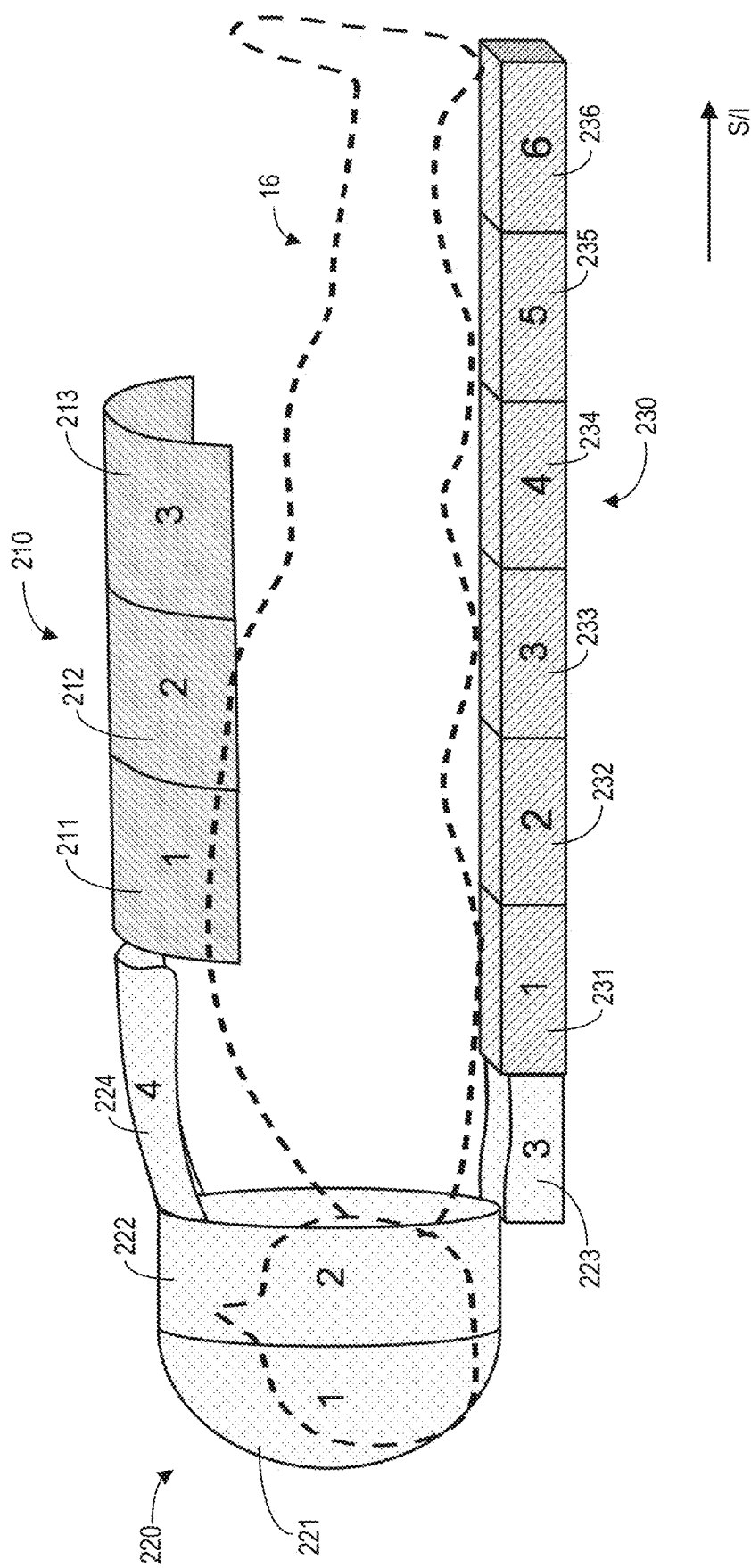
FIG. 2 is an example arrangement of RF coil arrays relative to an imaging subject.

The following description relates to various embodiments of selecting coil elements of one or more radio frequency (RF) coil arrays for receiving magnetic resonance (MR) signals in a magnetic resonance imaging (MRI) system, such as the MRI system depicted in FIG. 1. As shown in FIG. 2, a plurality of RF coil arrays may be arranged around a patient's body. During MRI, high image quality can be achieved by reconstructing one or more images with MR signals received with coil elements of the one or more RF coil arrays of high sensitivity to the MR signals generated from the scan location, and not receiving the MR signals via the other coil elements. By limiting the number of coil elements for receiving the MR signal, the signal to noise ratio of the reconstructed images may be improved due to low noise level. However, due to the uncertainty in positioning one or more of the RF coil arrays relative to the imaging subject, the sensitivity profiles of the coil elements are unknown. Therefore, a method for selecting the optimal coil elements for MRI is needed.

According to embodiments disclosed herein, one or more RF coil elements of each RF coil array may be selected to be used to image an imaging subject. The selected RF coil elements may be selected based on a measured sensitivity of each RF coil element, which may be used to localize the position of each RF coil element relative to the imaging space. The sensitivity of each RF coil element may be measured during a low resolution calibration scan performed prior to the main imaging scan. Then, based on a user-specified imaging region of interest and predetermined coil element grouping information, groups of RF coil elements within the RF coil array may be selected for receiving MR signals during the main scan. Groups of RF coil elements not selected may be deactivated so that signals received by the non-selected RF coil elements do not contribute to the final reconstructed images.

Figure 3:
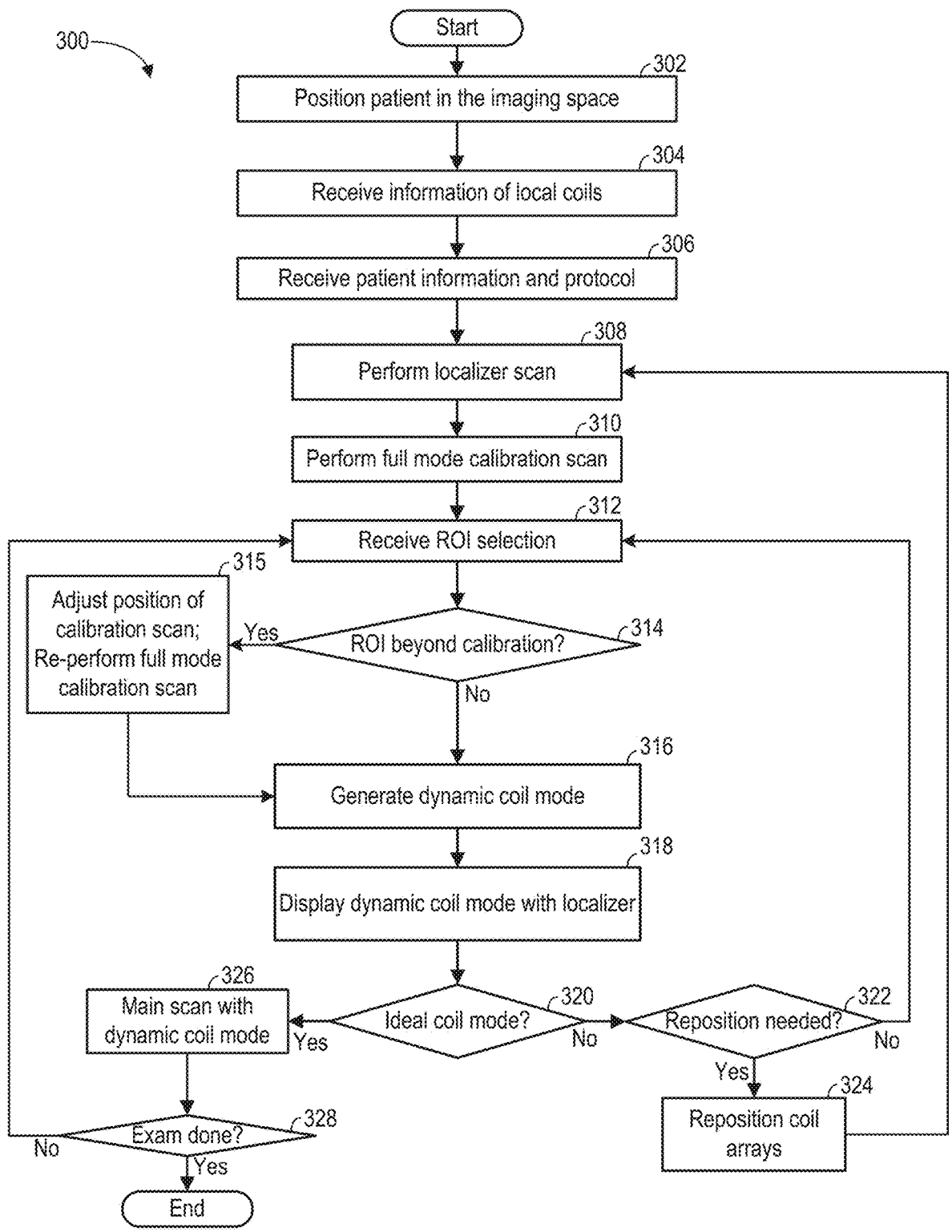
FIG. 3 is a high-level flow chart illustrating an example method for selecting RF coil arrays for MRI scan.
Figure 5:
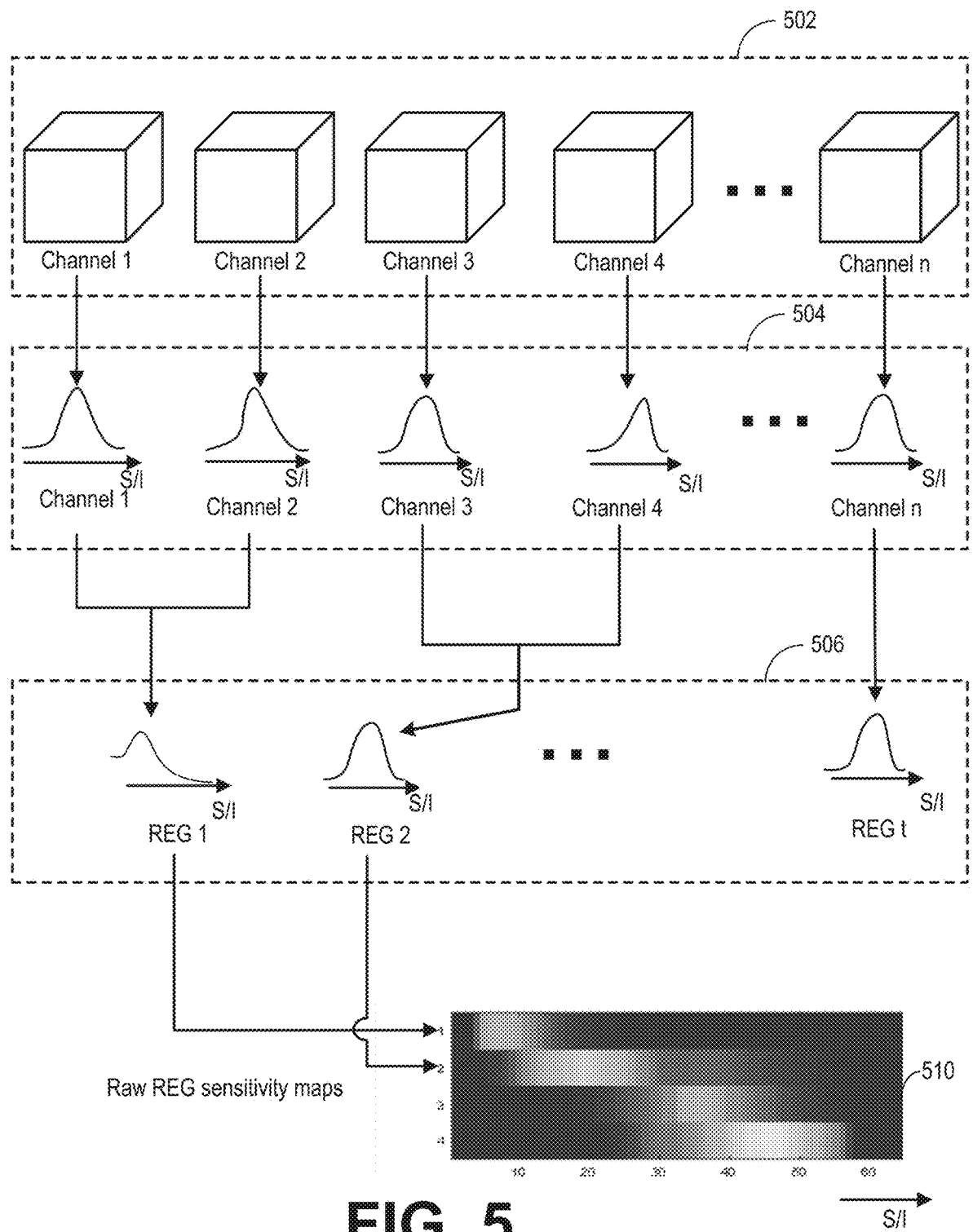
FIG. 5 illustrates the data processed by the subroutine of FIG. 4A.
Figure 6:
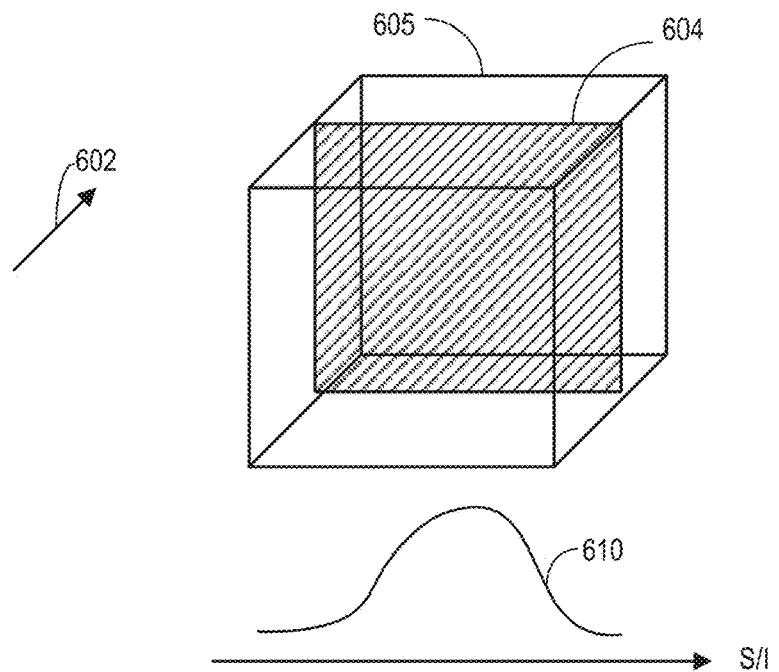
FIG. 6 illustrates an example a channel sensitivity map generated based on the calibration data.
Figure 9:
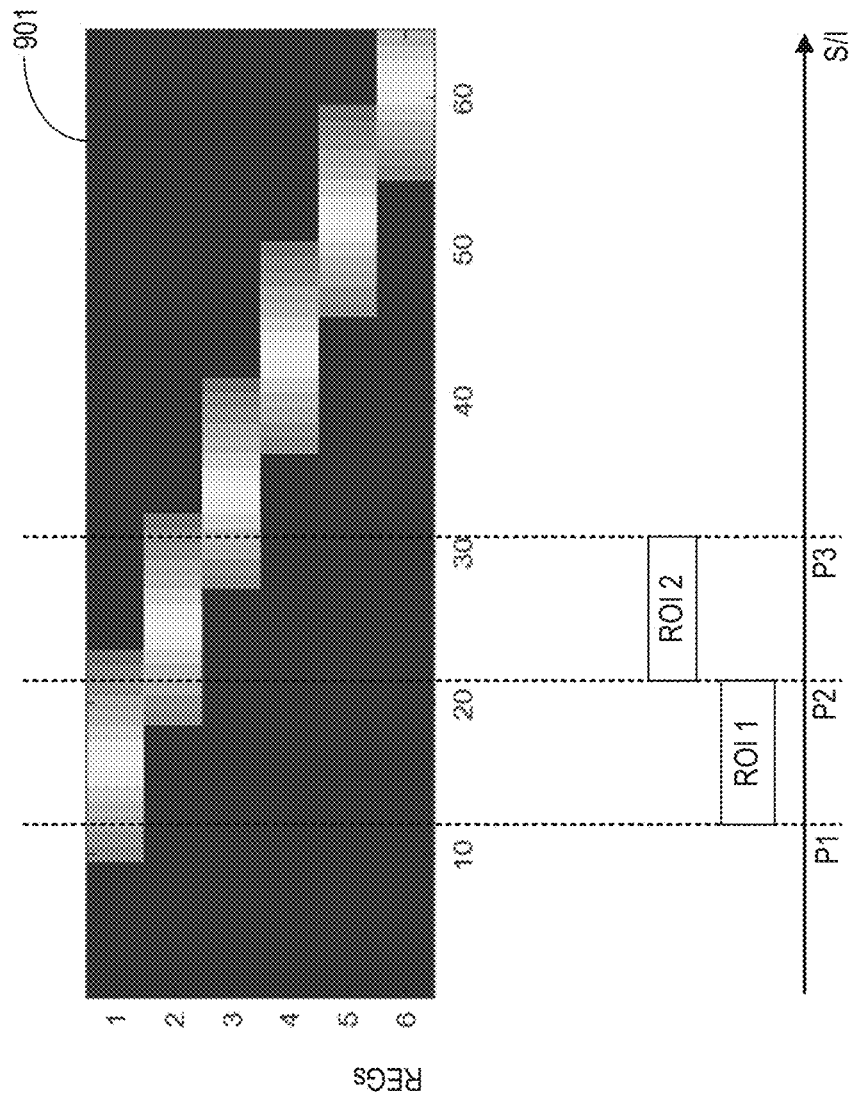
FIG. 9 illustrates example dynamic coil modes determined based on the REG sensitivity maps.
Figure 10:
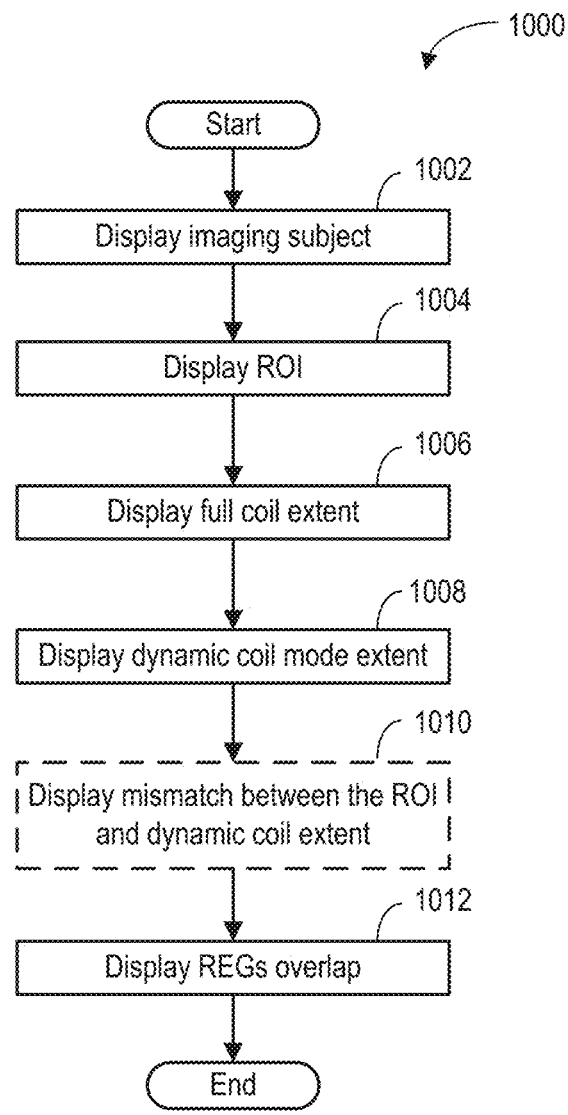
FIG. 10 is a flow chart illustrating an example subroutine for displaying the dynamic coil mode.
Figure 11:
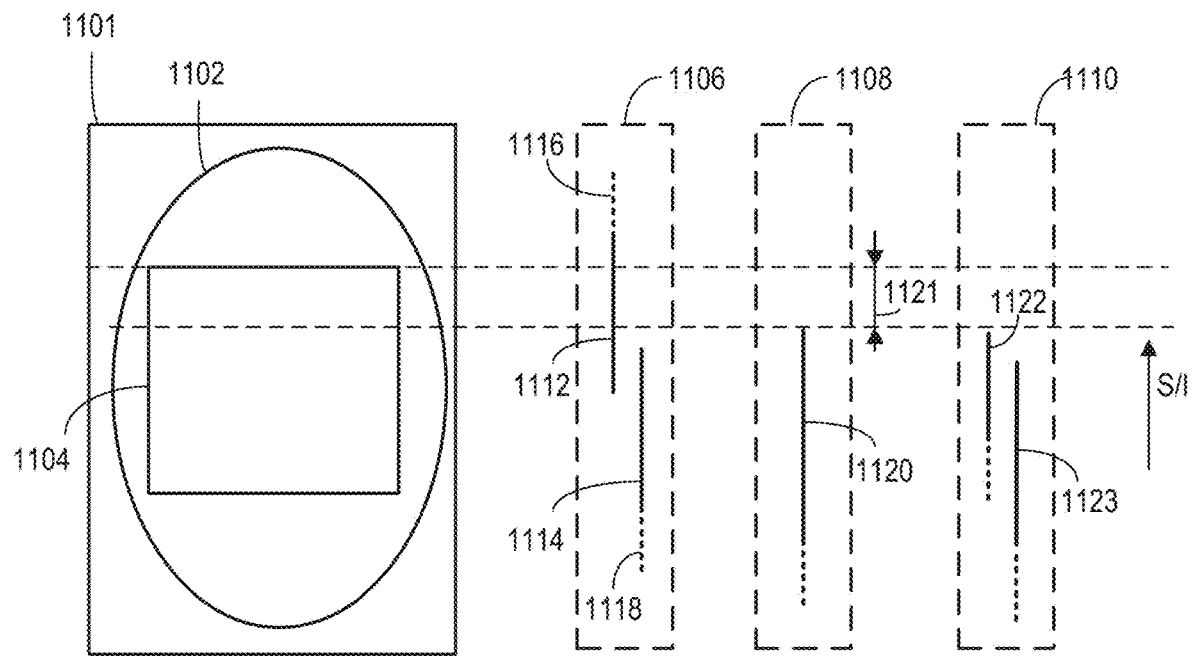
FIG. 11 shows examples of displayed coil array and REG sensitivity extents in various dynamic coil modes where the selected REGs match or mismatch a region of interest (ROI).
Figure 12:
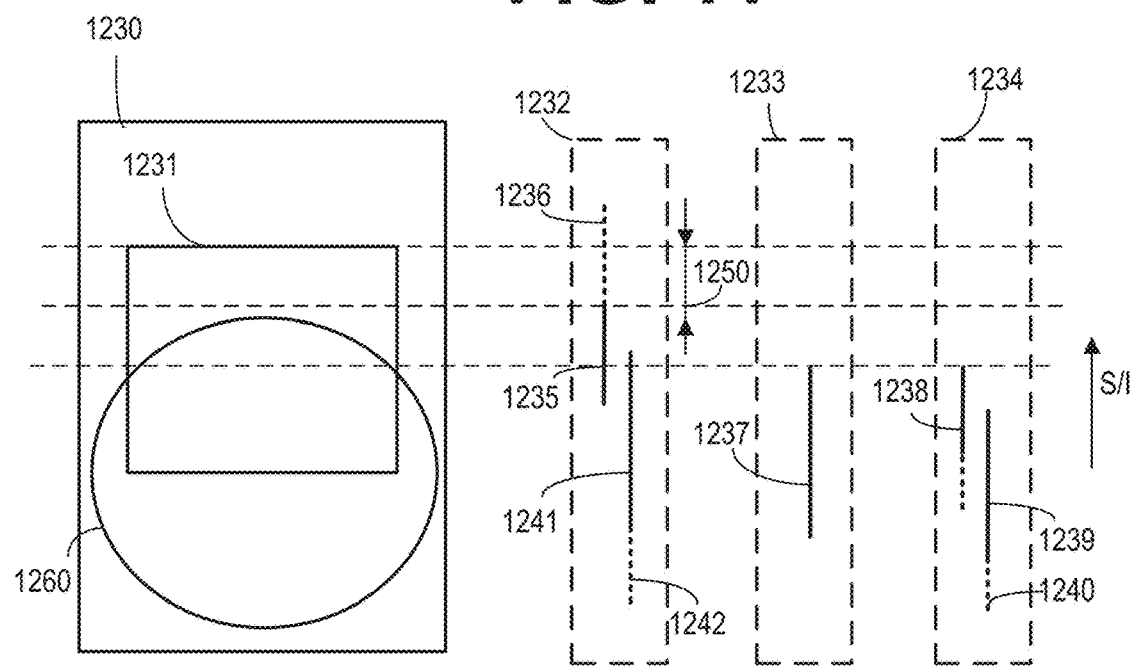
FIG. 12 shows examples of displayed coil array and REG sensitivity extents in various dynamic coil modes where the selected REGs match and mismatch the ROI.
Figure 13:
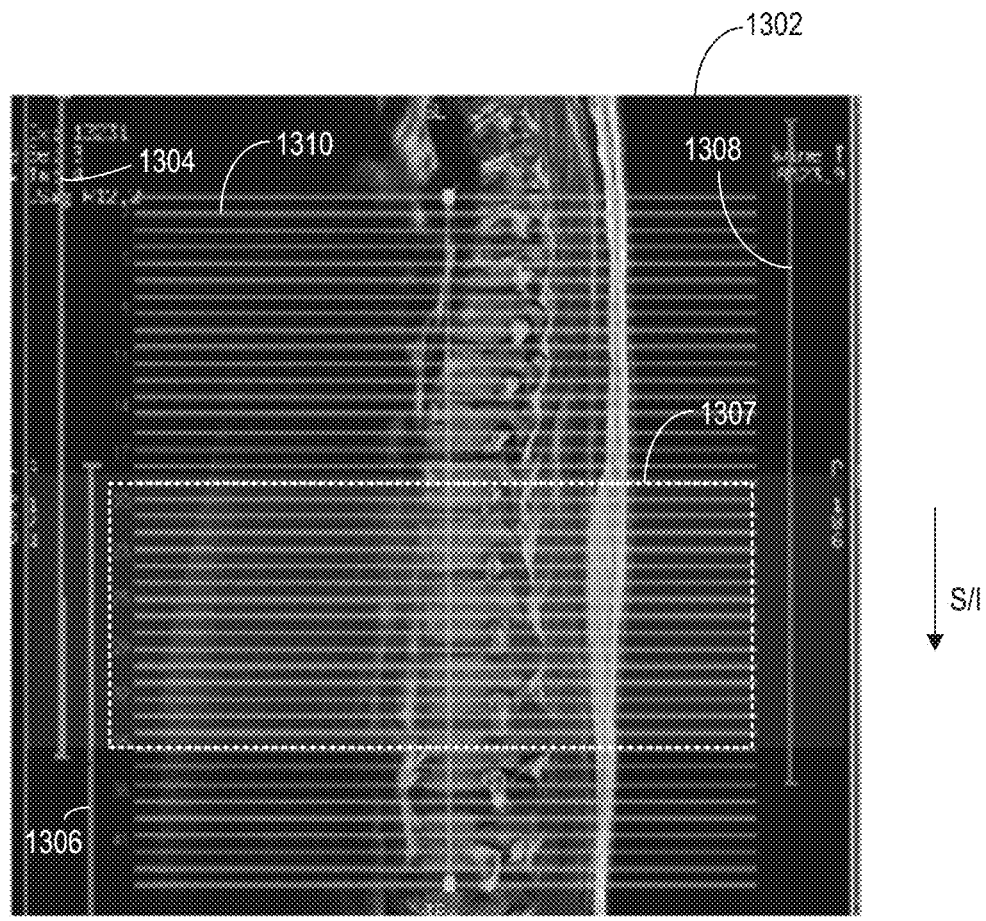
FIG. 13 is an example visual representation of a dynamic coil mode with an MRI image.
Figure 14:
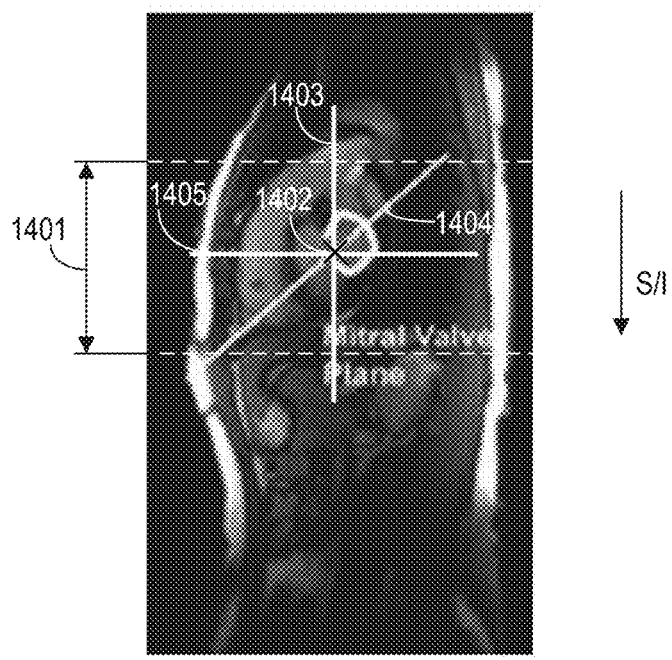
FIG. 14 illustrates examples of calibration FOV selections in a cardiac scan.

Accordingly, each coil array may include a plurality of coil elements, and one or more of the coil elements may be grouped together as a receive element group (REG). As shown in FIG. 3, during the MRI scan, MR signals received from selected REGs are reconstructed to form an image of the imaging subject. The REGs are selected based on data acquired from a lower resolution calibration scan according to subroutines of FIGS. 4A-4B. Data resulting from subroutine 400 are illustrated in FIG. 5. During the subroutines of FIGS. 4A-4B, a channel sensitivity map is generated for each channel of the coil array, as shown in FIG. 6, by projecting the calibration data to a coil selection direction. A REG sensitivity map is generated by combining the channel sensitivity maps corresponding to each REG. Based on the type of the coil array, the REG sensitivity map may be generated according to the subroutine of FIG. 7. FIGS. 8A-8C shows examples for processing raw REG sensitivity maps. A dynamic coil mode, which determines REG selection for scanning a ROI, may be generated based on the REG sensitivity maps and the ROI as shown in FIG. 9. The dynamic coil mode may be displayed to the operator according to an example subroutine shown in FIG. 10. FIGS. 11-13 show various examples of displaying the REG and coil array extents of dynamic coil modes together with images of the imaging subject and the ROI. During a cardiac scan, in order to image the heart from different angles, the ROIs may be rotated relative to a center point as shown in FIG. 14. The dynamic coil modes for the rotated ROIs may be determined based on datasets acquired in one calibration scan.

FIG. 1 illustrates a magnetic resonance imaging (MRI) apparatus 10 that includes a magnetostatic field magnet unit 12, a gradient coil unit 13, one or more local RF coil arrays (210, 220, and 230), an RF body coil unit 15, a transmit/receive (T/R) switch 20, an RF port interface 21, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance (MR) signals from the subject 16 to reconstruct an image of the slice of the subject 16 based on the MR signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field which inclines into one of three spatial axes perpendicular to each other, and generates a gradient field in each of frequency encoding direction, phase encoding direction, and slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

Three local RF coil arrays 210, 220, and 230 are shown herein. The local RF coil arrays are disposed, for example, to enclose the region to be imaged of the subject 16. In the static magnetic field space or imaging space 18 where a static magnetic field $B_0$ is formed by the magnetostatic field magnet unit 12, the local RF coil arrays may transmit, based on a control signal from the controller unit 25, an RF pulse that is an electromagnet wave to the subject 16 and thereby generates a high-frequency magnetic field $B_1$. This excites a spin of protons in the slice to be imaged of the subject 16. The local RF coil arrays receive, as a MR signal, the electromagnetic wave generated when the proton spin returns into alignment with the initial magnetization vector. In one embodiment, the local RF coil may transmit and receive an RF pulse using the same local RF coil. In another embodiment, the local RF coil may be used for only receiving the MR signals, but not transmitting the RF pulse. Details of the local RF coil arrays are presented in FIG. 2.

The RF body coil unit 15 is disposed, for example, to enclose the imaging space 18, and produces RF magnetic field pulses $B_1$ orthogonal to the main magnetic field $B_0$ produced by the magnetostatic field magnet unit 12 within the imaging space 18 to excite the nuclei. In contrast to the local RF coil arrays (such as local RF coil arrays 210 and 220), which may be easily disconnected from the MRI apparatus 10 and replaced with another local RF coil, the RF body coil unit 15 is fixedly attached and connected to the MRI apparatus 10. Furthermore, whereas coil arrays can transmit to or receive signals from only a localized region of the subject 16, the RF body coil unit 15 generally has a larger coverage area and can be used to transmit or receive signals to the whole body of the subject 16. Using receive-only RF coil arrays and transmit body coils provides a uniform RF excitation and good image uniformity at the expense of high RF power deposited in the subject. For a transmit-receive RF coil array, the coil array provides the RF excitation to the region of interest and receives the MR signal, thereby decreasing the RF power deposited in the subject. It should be appreciated that the particular use of the local RF coil arrays and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect one or more of the local RF coil arrays to the data acquisition unit 24 when the local RF coil arrays operate in receive mode, and to the RF driver unit 22 when operating in transmit mode. When the local RF coil arrays and the RF body coil unit 15 are both used in a single scan, for example if the local RF coil arrays are configured to receive MR signals and the RF body coil unit 15 is configured to transmit RF signals, then the T/R switch 20 may direct control signals from the RF driver unit 22 to the RF body coil unit 15 while directing received MR signals from the local RF coil arrays to the data acquisition unit 24. The RF body coil unit 15 may be configured to operate in a transmit-only mode, a receive-only mode, or a transmit-receive mode. The local RF coil arrays may be configured to operate in a transmit-receive mode or a receive-only mode.

The RF driver unit 22 includes a gate modulator (not shown), an RF power amplifier (not shown), and an RF oscillator (not shown) that are used to drive the RF coil arrays and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil arrays.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the MR signals received by the local RF coil arrays. In the data acquisition unit 24, the phase detector phase detects, using the output from the RF oscillator of the RF driver unit 22 as a reference signal, the MR signals received from the RF coil arrays and amplified by the preamplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25. One or more of the RF coil arrays may be coupled to the table 26 and moved together with the table.

The controller unit 25 includes a computer and a recording medium on which a program to be executed by the computer is recorded, in some embodiments. The program when executed by the computer causes various parts of the apparatus to carry out operations corresponding to predetermined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

Different RF coil arrays may be utilized for different scanning objectives. To that end, one or more the RF coil arrays, such as RF coil array 210, may be disconnected from the MRI apparatus 10, so that a different coil array may be connected to the MRI apparatus 10. The RF coil arrays may be coupled to the T/R switch 20, and thus to the RF driver unit 22 and the data acquisition unit 24, via a connector and an RF port interface 21. Each RF coil array may be electrically coupled to one or more connectors (such as connector 17a-17c). The connector(s) may be plugged into the RF port interface 21 to electronically couple the RF coil array to the T/R switch 20. For example, coil array 210 may be electronically coupled to the MRI apparatus 10 by plugging connector 17c into RF port interface 21. As such, the local RF coil arrays may be easily changed.

FIG. 2 shows an example arrangement of RF coil arrays of the MRI apparatus 10 of FIG. 1 relative to the subject 16. In particular, an anterior coil array 210, a head-neck coil array 220, and a posterior coil array 230 are positioned on top of the body, over the head-neck, and under the body, respectively. Each coil array is an individual piece and may be physically separated from each other. One or more of the coil arrays (such as the anterior coil array 210 and head-neck coil 220) may be connected to or removed from the MRI apparatus 10 by the operator. The posterior coil array 230 may be embedded within and moved together with table 26. Each coil array may include one or more coil elements, and each coil element receives MR signals generated from a specific volume of the subject 16. The coil elements may or may not overlap with each other. For example, the anterior coil array 210 includes three rows of coil elements (211-213) arranged along the superior to inferior (S/I) direction. Each row (211, 212, 213) may include multiple (e.g., 4, 5, 6, 7, 8, etc.) coil elements along the direction perpendicular to the S/I direction. The head coil array 220 includes four rows of coil elements (221-224) to cover different surface area of the subject; and the posterior coil array 230 includes six rows of coil elements (231-236) arranged along the S/I direction. In some embodiments, the relative position among the coil elements of a coil array may be fixed with respect to each other. In some embodiments, the relative position among the coil elements of a coil array may be variable relative to each other.

The coil elements of one coil array or coil elements from multiple coil arrays may be grouped into receive element groups (REGs) according to REGs information. The REGs information is predetermined rules for grouping coil elements of the coil array for transmitting and/or receiving MR signals. Different REGs include different combinations of coil elements. A coil element may be included in more than one REG. The REGs information may be determined based on the imaging objective, geometry of the coil array, hardware limitations (e.g., multiple coil elements must be turned on/off at the same time), and so on. The REGs information may further provide exclusive REGs. For example, when one coil element is included in two REGs, the two REGs are exclusive of each other, meaning that they cannot be selected at the same time.

Take anterior coil array 210 as an example. All coil elements in the anterior coil array 210 may be grouped as a first REG. Coil elements in row 211 may be grouped as a second REG; coil elements in row 212 may be grouped as a third REG; and coil elements in row 213 can be grouped as a fourth REG. Coil elements in a column (along the direction perpendicular to the rows) may be grouped as a fifth REG. The first REG and the second REG are exclusive of each other because they both include coil elements in row 211. The second REG and the fifth REG are exclusive of each other because they both include a coil element at the cross of row 212 and the column, and so on. REGs of the posterior coil array 230 may be defined similarly. As another example, coil elements in rows 223 and 224 of the head-neck coil array 220 may be grouped as one neck-piece REG. In some embodiments, each coil element may represent a separate REG. The REGs information may be saved in the memory of the MRI apparatus 10.

Each coil element of the coil arrays is electronically coupled to the controller unit (such as controller unit 25 of FIG. 1) via a channel. In particular, each coil element can sense the MR signals and transfer the MR signal to the data acquisition unit (such as data acquisition unit 24 of FIG. 1) of the MRI apparatus via the corresponding channel. The data acquisition unit then outputs digitized MR signals to the controller unit. As such, the channels of the coil arrays may also be grouped according to the REGs information. In some examples, each individual coil element may be coupled to one channel, and each channel may only be coupled to one coil element (e.g., anterior coil array 210 may include 12 coil elements coupled to the data acquisition unit via 12 separate channels). In other examples, more than coil element may be coupled to a given channel (e.g., anterior coil array 210 may include 12 coil elements coupled to the data acquisition unit via 6 separate channels).

FIG. 3 shows an example method 300 for performing a scan using the MRI apparatus (such as the MRI apparatus 10 of FIG. 1) with a dynamic coil mode determined based on a calibration scan executed before a main scan. In particular, the coil elements that are used for receiving MR signals in the main scan are selected based on their sensitivity and the ROI. During the calibration scan, a dataset is acquired from each coil element of one or more RF coil arrays. The sensitivity of each element is determined by projecting the dataset along a coil selection direction to obtain the channel sensitivity maps. The channel sensitivity maps of the coil elements are combined into REG sensitivity maps based on the REGs information. The REG(s) for the main scan may be selected based on the REG sensitivity maps and the ROI. Method 300 also includes displaying a visual representation of the selected REG, to help the operator verify or adjust the coil array position and/or the ROI before the main scan. When a plurality of RF coil arrays are plugged into the MRI apparatus, each RF coil array may be considered individually. That is, a dynamic coil mode may be determined for each coil array. Alternatively, the RF coil arrays may be considered collectively, and a dynamic coil mode may be determined for all of the coil arrays. Method 300 may be executed by controller unit 25 of FIG. 1 according to instructions stored in non-transitory memory.

At 302, responsive to the operator's instruction, the table (such as table 26 of FIG. 1) is moved to position the subject (such as a patient) in the imaging space (such as imaging space 18 of FIG. 1).

At 304, information of the coil arrays that are arranged around the patient is received at the controller unit, so that the type of the coil arrays may be identified. The information of the coil arrays may be received via the operator input. Alternatively, the MRI apparatus may automatically identify the coil array type, for example, by identifying the connector (such as connectors 17a-17c of FIG. 1) of the coil array that has been plugged into the apparatus. Method 300 may load the REGs information related to the coil arrays that are connected to the MRI apparatus. The connected coil arrays may also be displayed to the operator via the display unit.

At 306, operator input is received at the controller unit regarding the patient information and the imaging protocol. In particular, the operator may select the protocol based on the anatomy that is going to be scanned. By selecting a protocol, a field of view (FOV) may be determined correspondingly. The FOV defines a three-dimensional volume of the patient. In one example, the FOV defines the volume that is going to be scanned for the localizer scan and the calibration scan. For example, in cardiac imaging, the FOV is a cube with 20 cm long edges to cover the entire heart. In some examples, the FOV may include an entirety of the imaging subject/MRI bore volume that the MRI system is capable of imaging without moving the table on which the imaging subject is placed.

At 308, a localizer scan is performed via the controller unit (e.g., the controller unit may send commands to the components of the MRI system to execute the localizer scan). The localizer scan may be a low resolution scan of the FOV. Herein, the low resolution scan is a scan with large voxel volume, which can be completed with reduced measurement time. In one example, the image data acquired during the localizer scan may be used to reconstruct an MR image of the FOV. The localizer scan may generate one or more 2D images of the subject, for example, in the sagittal, coronal, and/or the axial planes.

At 310, a full mode low resolution calibration scan is performed in the calibration FOV via the controller unit (e.g., the controller unit may send commands to the components of the MRI system to execute the calibration scan). The calibration FOV may be either the same as or different than the localizer FOV. During the full mode calibration scan, each coil element of one or more of the coil arrays receives MR signals. One 3D dataset is generated from MR signals received from each channel corresponding to the coil element. As such, each 3D dataset corresponds to one channel of the plurality of channels, and to one coil element to which the channel is electronically coupled. In some embodiments, MR signals from all channels of all coil arrays are collected. In some embodiments, MR signals from channels of selected coil arrays are collected. The coil arrays may be selected based on the relative position of the coil array from the imaging area. For example, coil arrays that are within a threshold distance from the scan center are set in the receiving mode during the calibration scan, while the non-selected coil arrays do not receive the MR signals. The threshold distance may be a distance within which the coil array is sensitive to the MR signals generated from the imaging area. In one embodiment, the localizer scan and the calibration scan may be combined, wherein a low resolution 3D scan of the FOV may generated both the localizer scan image and the calibration data.

At 312, a ROI selected by the operator is received at the controller unit. For example, images generated by the localizer scan may be displayed on the display unit, and the operator may select the ROI for the main scan based on the images. The ROI may be smaller than the localizer FOV, at least in some examples. For example, the localizer FOV may be 50 cm along a scan direction, and the ROI may be 20-30 cm in the scan direction. In some embodiments, the ROI may be defined by selection of the position of the corners of a 3D volume. In some embodiments, the ROI may be defined by the center position and ranges in each of the superior-inferior, medial-lateral, and posterior-anterior directions. In yet other embodiments, the ROI may be in the shape of a cube, which is defined by the center position and a range, and a rotational angle. For example, for cardiac scan, the ROI may be defined by the center position of the heart and a predetermined range. Thus, the ROI for coil selection is the same regardless of the view angles. In this way, the same dynamic coil mode is applied to various angle scans for cardiac imaging, so that any reconstruction or post processing, such as parallel imaging processing or intensity correction processing, that requires dynamic coil sensitivity maps can share the same calibration scan data. See FIG. 14 for details.

At 314, method 300 determines via the controller unit if the ROI is beyond the calibration FOV (e.g., beyond the FOV imaged by the Mill system during the calibration scan). For example, when the operator indicates the ROI, the ROI may extend outside of the calibration FOV. If the ROI extends beyond the calibration FOV, method 300 proceeds to 315 to adjust the full mode calibration center and re-perform the full mode calibration scan. For example, the table may be moved or other action may be performed to adjust the center of the calibration FOV in order to maintain the ROI within the calibration FOV. Upon adjusting the calibration center and re-performing the calibration scan, method 300 proceeds to 316.

If it is determined at 314 that the ROI does not extend beyond the calibration FOV or the calibration scan is re-performed at 315 with an adjusted calibration center, method 300 proceeds to 316 to generate, via the controller unit, a dynamic coil mode based on the calibration scan and the ROI selection. The dynamic coil mode determines the REG(s) to be used for imaging the ROI during the main scan. Processes of generating the dynamic coil mode are described in more detail below with respect to FIGS. 4A-4B.

At 318, a visual representation of the dynamic coil mode is displayed together with images acquired via the localizer scan at 308 via the display unit. Details for displaying the dynamic coil mode are presented in FIG. 10. Briefly, an image of the imaging subject acquired during the localizer scan may be displayed along with an annotation illustrating the ROI. An extent of one or more REGs relative to the ROI may also be displayed. An extent of an REG may represent coverage of that REG along the display direction, e.g., how much of the ROI that REG is sensitive to. In some examples, if a portion of the ROI is not covered by a REG, a mismatch notification may be output on the display to notify the operator that the ROI may not be sufficiently imaged with the current RF coil array placement.

At 320, method 300 includes receiving an input at the controller unit from the operator indicating whether the current dynamic coil mode is ideal, e.g., based on the display at 318. For example, based on the display, the operator may determine whether the position of the ROI and/or the extent of the REG(s) are satisfactory. In one embodiment, the operator may determine whether the extent of the REGs of the dynamic coil mode matches the ROI. Responsive to the selected REGs of the dynamic coil mode not matching the subject, the operator may either reposition the coil array(s) or adjust the ROI. For example, the operator may reposition one or more of the coil arrays relative to the subject (e.g., the operator may adjust a position of a surface anterior coil array, which may be movable) or the operator adjust a position of the imaging subject relative to the MRI bore and/or RF coil arrays. In some embodiments, the operator may determine whether the overlap between the REGs is too large. Responsive to the overlap being greater than a threshold overlap, the operator may reposition one or more of the coil arrays. If the controller unit receives the confirmation that the dynamic coil mode is ideal, method 300 proceeds to 326 and executes the main scan via the controller unit, which is described in more detail below. Otherwise, if the controller receives the operator's input of adjusting the parameters or system arrangement, the method proceeds to 322.

At 322, method 300 determines via the controller unit if one or more of the receive RF coil arrays to be used in the main scan need be repositioned so that the ROI is fully covered. If one or more RF coil arrays need be repositioned, method 300 proceeds to 324 to reposition the RF coil array(s). For example, if the anterior RF coil array does not fully cover the ROI, the table may be moved so that the imaging subject is out of the bore of the MRI system and the operator may reposition the anterior RF coil array (e.g., move the RF coil array up or down on the imaging subject). In still further examples, additionally or alternatively, the table may be moved and/or the imaging subject may be moved so that the absolute position of ROI is adjusted (e.g., the same anatomy may be included in the ROI, but the ROI may be in a different position relative to the MRI system and RF coil arrays). Upon repositioning of the RF coil array(s), method 300 proceeds to 308 to re-perform the localizer scan, re-perform the calibration scan, obtain the ROI, etc. If the RF coil array(s) that are to be used in the main scan are not to be repositioned, method 300 loops back to 312 to obtain a new ROI. The new ROI may be smaller than the previous ROI, which may facilitate full coverage of the ROI by one or more REGs.

At 326, the main scan is executed over the ROI using the dynamic coil mode via the controller unit (e.g., the controller unit may send commands to the components of the Mill system to execute the main scan). In particular, during the main scan, MR signals are received from coil elements in the REGs selected based on the dynamic coil mode, but not from any coil elements that are not in the selected REGs. In other words, the coil elements not in the selected REGs are turned off during the main scan. The main scan is a high resolution 3D scan to generate high quality images of the ROI. The main scan has a lower voxel volume than the localizer scan at 308 and the calibration scan at 312. Executing the main scan may further include reconstructing and displaying one or more MRI images based on the received MR signals.

At 328, method 300 determines via the controller unit whether the exam (e.g., the current scan session) is completed. The scan session may be ended via the operator input. Alternatively, method 300 may determine whether the scan session is ended based on the imaging protocol selected at 306. If the session is not ended, method 300 proceeds to 312 to receive a new selection of a ROI.

In some examples, when a new ROI is received, method 300 may determine whether the position of the center of the ROI has changed. If the center position of the new ROI is within a threshold distance (such as within 200 mm) from the current ROI, the dynamic coil mode may be determined based on the existing dataset acquired during the calibration scan. For example, the dynamic coil mode may be updated based on the current REG sensitivity map generated in step 314. Then, the new ROI may be scanned with the updated dynamic coil mode without additional calibration scan. If the center position of the ROI has changed, a new calibration scan may be executed to generate the dynamic coil mode for the new ROI. By limiting the number of calibration scans, the total time required for performing the MRI scan is reduced.

As one example, when performing a cardiac scan, multiple oblique scans with various angles may be performed when switching among two chamber, three chamber, four chamber, and short axis views, which may trigger different coil modes for coil selection based on the scanning volumes only. This increases the number of calibration scans that are performed. Thus, when the selected scanning protocol is a cardiac scan (or other protocol with multiple angles and small variability in anatomy size and scan center), based on the size and position of the human heart, the FOV is automatically set to a fixed volume (such as a cube with edges of 20 cm). FIG. 14 shows an example MRI image of heart. The FOV along the S/I direction is set to be 20 cm. The operator may adjust the ROI to obtain images of the heart at different angles. For example, the ROI may be rotated three-dimensionally around one or more axes of 1403, 1404, and 1405 relative to the center 1402 of the ROI, to the obtain images of the heart at various angles. If the FOV is the same and the center position of the ROI has not changed, the dynamic coil mode for performing the main scans of the ROI may be updated based on the same REG sensitivity maps acquired from the calibration scan, rather than triggering a new calibration scan.

Figure 4A:
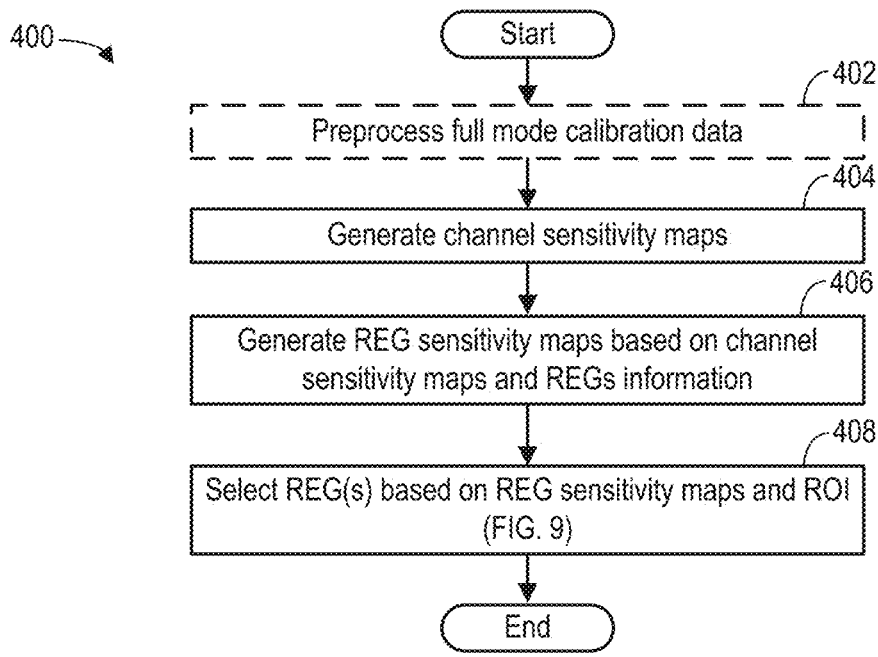
FIG. 4A is a flow chart illustrating an example subroutine for determining a dynamic coil mode based on datasets acquired from a calibration scan.
Figure 4B:
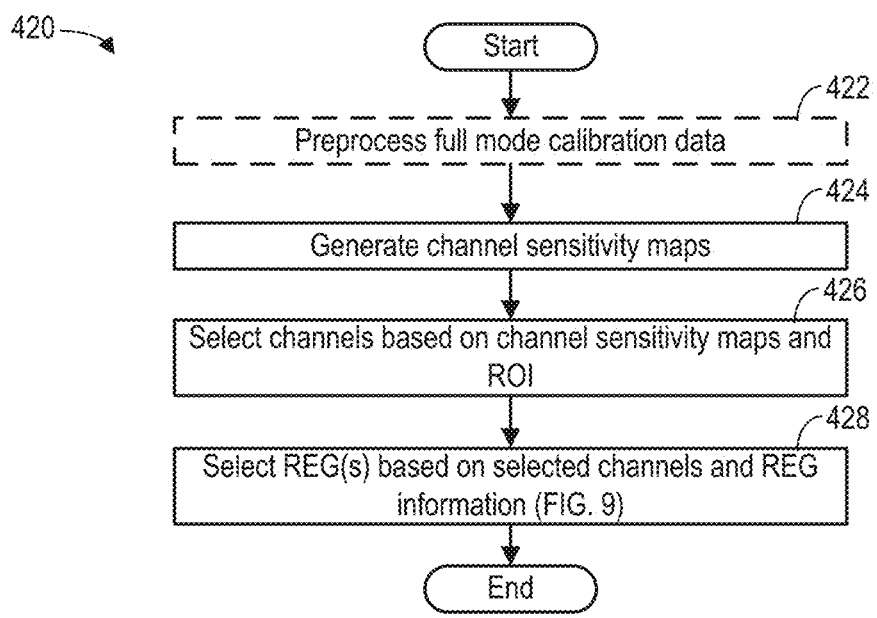
FIG. 4B is a flow chart illustrating another example subroutine for determining the dynamic coil mode based on datasets acquired from the calibration data.

FIG. 4A and FIG. 4B show two example subroutines 400 and 420 for generating the dynamic coil mode based on the calibration data and the ROI. The dynamic coil mode determines the REG(s) used for main scan of the ROI. The dynamic coil mode is determined based on the REG sensitivity maps and the ROI. The REG sensitivity maps may be generated by first combining the channel sensitivity maps based on the REGs information, and then selecting the REGs based on the ROI, as shown in FIG. 4A. Alternatively, as shown in FIG. 4B, the REGs may be selected by first selecting the channels based on the ROI, and then combing the channels based on the REGs information. In some embodiments, one REG sensitivity map may be generated for each REG. FIG. 5 is a graphic illustration of the subroutine of FIG. 4A.

Turning to FIG. 4A, after performing the full mode calibration scan, subroutine 400 optionally processes the datasets acquired during the calibration scan at 402. In particular, subroutine 400 may perform error corrections on each 3D dataset of each channel. For example, one or more of the frequency map, the phase map, and slice gradwarp error map may be applied to the dataset to correct spatial distortions. Through the preprocessing, errors in 3D position of each data point of the digitized MR signals may be corrected.

At 404, subroutine 400 generates a 1D channel sensitivity map for each channel. Specifically, the 3D dataset of each channel acquired during the calibration scan may be projected to the coil selection direction. In one example, the coil selection direction may be the S/I direction. FIG. 6 illustrates an example channel sensitivity map 610 that may be obtained by projecting the 3D dataset 605 onto the S/I direction. For example, the 3D dataset 605 may first be projected onto the sagittal plane 604 along the medial-lateral (R/L) direction 602. For example, to project the 3D dataset to a 2D plane, data points along the medial-lateral direction 602 are summed to obtain a data point in the sagittal plane 604. Then, the projected 2D data may be projected again onto the S/I direction.

At 406, the REG sensitivity maps are generated based on the channel sensitivity maps and REGs information. The channel sensitivity maps may be combined according to the REGs information. For example, the channel sensitivity maps of the channels or coil elements within each of the predetermined REGs are summed for each data point in the coil selection direction. As such, the sensitivity of each REG is obtained. The sensitivity of each REG may be arranged side by side along the projected direction, as shown in 510 of FIG. 5, to obtain a raw REG sensitivity map. The raw REG sensitivity map is then processed based on the type and configuration of the coil array. Details for processing the raw REG sensitivity maps are presented in FIGS. 7 and 8A-8C.

At 408, the REG(s) are selected based on the REG sensitivity maps and the ROI received at 312 of FIG. 3. FIG. 10 shows examples for selecting REG(s). Subroutine 400 then ends.

FIG. 4B shows an alternative subroutine 420 for determining the dynamic coil mode based on the calibration data. Step 422 and step 424 are the same as step 402 and step 404, respectively. The full mode calibration data is optionally preprocessed to correct any distortion and error. Then, the channel sensitivity map is calculated for each channel or coil element based on the preprocessed calibration data.

Different from subroutine 400 of FIG. 4A, in subroutine 420, the channel sensitivity maps are first selected based on ROI, then grouped based on REGs information. Specifically, at 426, the channels that may receive MR signals are selected based on the channel sensitivity maps and the ROI. Similar to the REG selection that will be explained in more detail below, the sensitivity of each channel may be compared to the ROI. Each channel that has sensitivity that overlaps with the ROI may be selected. Then, at 428, one or more REG(s) are selected based on the selected channels and REGs information, as each channel may be mapped to one or more REGs. For example, an anterior RF coil array may include 16 channels, each corresponding to a respective coil element of the coil array. The 16 coil elements may be arranged in a four by four array (e.g., four rows of four coil elements), and each row may comprise a different REG. The sensitivity of each coil element may be determined from the channel sensitivity maps, and the coil elements that have sensitivity within the ROI may be selected. For each selected channel/coil element, the REG to which that coil element belongs may be identified, and each REG that includes a selected coil element may be selected for the main imaging scan. This may include selecting a REG and receiving MR signals from each coil element of the REG, even if only one coil element of the REG is localized in/displays sensitivity to the ROI. In the anterior coil array example presented above where a REG may be defined by one row of coil elements, if at least one coil element of that row has sensitivity within the ROI, the entire REG/row of coil elements is selected for imaging. Subroutine 420 then ends.

FIG. 5 is a graphical representation of subroutine 400 of FIG. 4A. The low resolution data acquired during the calibration scan includes preprocessed volumetric (e.g., 3D) data for each channel, shown herein as 3D dataset 502. Each 3D channel set of 3D dataset 502 corresponds to one channel or coil element of the RF coil arrays. A total of n channels are shown here. Each channel set of the 3D dataset 502 is projected to the coil selection direction (e.g., the S/I direction) to obtain a respective 1D channel sensitivity map, thus generating a plurality of channel sensitivity maps 504. Thus, n channel sensitivity maps are generated for n channels. Details regarding the projection procedure are presented in FIG. 7.

In one example, the coil selection direction may be a direction along which coil elements have different coverages. In other words, the extent of one or more coil elements covers different regions along the coil selection direction. For example, if an RF coil array comprises a four by four array of coil elements, the RF coil array may be arranged into four REGs, each REG comprising a row of coil elements extending along a first direction (e.g., horizontally). The coil selection direction may be along a second direction perpendicular to the first direction (e.g., vertical), as the coil elements of each REG has different coverage along the second direction. In another example, if the RF coil array is arranged into four REGs with each REG comprising a column extending along the second direction, the coil selection direction may be along the first direction. In one example, the RF coil array may include REGs that have different coverages in more than one direction. The coil selection direction may be one of the multiple directions, determined based on the imaging protocol. In another example, the coil selection direction may be the same as the slice selection direction during the MRI scan. In other words, the coil selection direction is perpendicular to the plane containing the imaging slice. The coil selection direction may also be the same as the scan direction.

As shown in subroutine 400, the channels are first combined based on the predetermined REGs information. As explained earlier, the REGs information is predetermined rules for grouping coil elements of the coil array for transmitting and/or receiving MR signals. The channel sensitivity maps are grouped and combined for each REG. As explained earlier, each REG may correspond to a set of one or more RF coil elements, and thus grouping the channel sensitivity maps may include, for a given REG, combining the channel sensitivity maps for each channel that is coupled to a coil element belonging to the given REG. Herein, t REGs are shown at 506. For example, the REGs information defines REG 1 as including channel 1 and channel 2. The channel sensitivity maps of channels 1 and 2 are summed along the S/I direction. Similarly, channel sensitivity maps of channels 3 and 4 are combined for REG 2. REG t includes channel n, and so on.

Raw REG sensitivity maps are obtained based on the combined sensitivity maps 506 of the t selected REGs. An example set of raw REG sensitivity maps including four REGs is shown in 510. The x-axis is the pixel number in S/I direction. Alternatively, the x-axis may be distance (such as centimeter) along the coil selection direction. Each row corresponds to the sensitivity of one REG along the S/I direction. The values of the sensitivity are displayed along the S/I direction in grayscale. The brighter the grayscale value, the higher the value of sensitivity.

Figure 7:
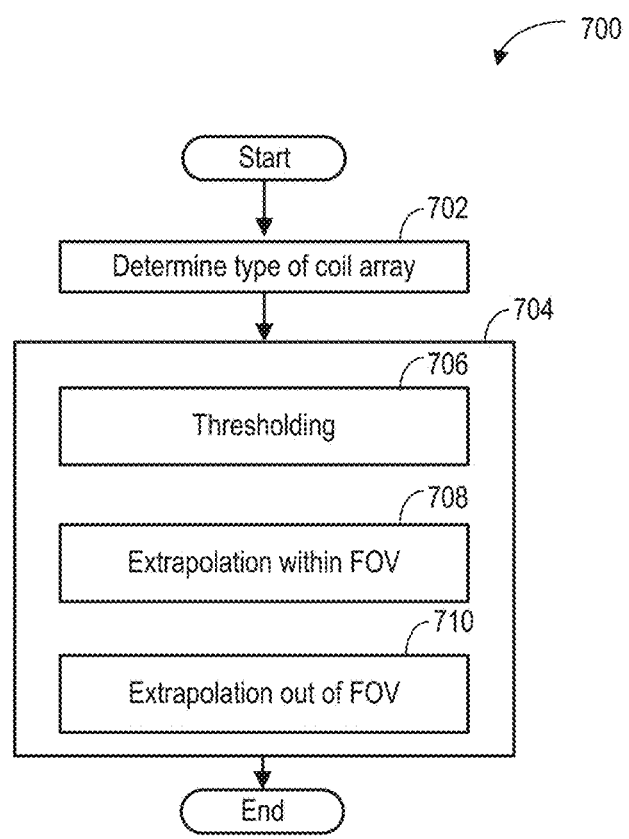
FIG. 7 is a flow chart illustrating an example subroutine for generating a receive element group (REG) sensitivity map.

Turning to FIG. 7, subroutine 700 for processing the raw REG sensitivity map generated at 408 of FIG. 4A is shown. The raw REG sensitivity map is processed based on the type of the coil array. FIGS. 8A-8C shows examples of REG sensitivity map generated based on the raw REG sensitivity maps via subroutine 700.

At 702, the type of the coil array represented in the raw REG sensitivity maps is determined. For example, the subroutine may determine if the RF coil array is a fixed-to-table coil (e.g., posterior coil), floating coil (e.g., anterior coil), rigid coil (e.g., head and neck coil), flexible coil (e.g., air coil), or other type of RF coil array. In other examples, the subroutine may determine the length of the RF coil array (e.g., relative to the FOV) and/or number of REGs in the RF coil array.

At 704, the sensitivity of each REG in the raw REG sensitivity maps may be processed based on the type of coil array. In one example, at 706, the raw REG sensitivity maps are thresholded with a threshold sensitivity level. The threshold sensitivity level may be determined based on the noise level of the MR signals. Any data point of the REG sensitivity map having a value lower than the threshold sensitivity level is set to a fixed low level (such as zero). An example set of raw REG sensitivity maps 801 is shown in FIG. 8A for an RF coil array having four REGs, such as the head-neck coil array. Similar to the raw REG sensitivity maps 510 of FIG. 5, each row of the set of raw REG sensitivity maps 801 represents the combined sensitivities of each channel corresponding to one REG along the coil selection direction. After thresholding, low level data points are discarded by setting those data points (e.g., pixels) to a zero value. The sensitivity extent for each REG may be determined as the extent of non-zero sensitivity of the REG. For example, the sensitivity extent 810 of the first REG 811 is shown in FIG. 8A.

In another example, additionally or alternatively, the processing may include replacing the thresholded sensitivity of each REG with a Gaussian fitting of the same extent. The Gaussian fitting replacement may be applied to REGs of an anterior coil array or a posterior coil array, for example. In one example, as shown in FIG. 8B, the thresholded sensitivity of the first REG of the set of raw REGs sensitivity maps 803 is replaced with a Gaussian fitting 822. The Gaussian fitting 822 is shown in grayscale of the set of REG sensitivity maps 804. For each row of the set of raw REG sensitivity maps, the thresholded sensitivity values are replaced with a Gaussian curve of the same extent along the coil selection direction (such as the S/I direction). In one example, the Gaussian curve is determined by fitting the thresholded sensitivity of the REG. In another embodiment, the Gaussian curve has a maximum value and variance determined by the original signal (e.g., the maximum value is the same as or similar to the maximum value of the original signal).

In an example, at 708, the REG sensitivity maps may be extrapolated within the FOV. In one example, the REG sensitivity maps may be extrapolated to the REGs not receiving MR signals during the calibration scan. In another example, the REG sensitivity maps may be extrapolated to the REGs that receive low amplitude MR signals during the calibration scan. The REG sensitivity maps may be extrapolated based on the information of the REGs of the coil array. For example, the sensitivity of a first REG included in the REG sensitivity maps may be extrapolated to a second REG if the second REG has the same configuration as the first REG. The configuration may include the number and type of coil elements, relative position of the coil elements, and the rigidity of the coil array.

FIG. 8B shows an example of extrapolated set of REG sensitivity maps 804 of an anterior coil array based on the set of raw REG sensitivity maps 803. In the set of raw REG sensitivity maps 803, the sixth REG has low values. As such, all values of the sixth REG in the set raw of REG sensitivity maps 803 are set to zero during the thresholding process. As the sixth REG is of the same type of the fifth REG, and the relative position of the sixth REG and the fifth REG is assumed to be the same as the relative position of the fifth REG and the fourth REG, the sensitivity of the sixth REG may be determined based on the sensitivity of the fifth REG. In one example, sensitivity of the sixth REG 805 is added to the set of REG sensitivity maps 804 by shifting the sensitivity of the fifth REG based on the relative position between the fifth and sixth REGs. In another example, sensitivity for the sixth REG may be a Gaussian curve with an extent the same as the extent of the fifth REG. As such, without an additional calibration scan, the extrapolated set of REG sensitivity maps 804 may be generated to cover the full FOV 820 along the S/I direction.

In yet another example, at 710, the REG sensitivity maps may be extrapolated outside of the FOV. The extrapolation may be based on similarity of the REGs, the coil array rigidity, and type and position of the coil elements. Extrapolation outside of the FOV may be applied to posterior coil arrays or other arrays with coil elements that lie outside the FOV and/or that are not prone to movement or positioning variability. As the calibration scan may not be able to cover the full extent of the coil array along the coil selection direction, by extrapolating the REG sensitivity maps outside of the FOV, a set of REG sensitivity maps for the entire coil array may be obtained based on one calibration scan of the imaging area.

FIG. 8C shows an example of an extrapolated set of REG sensitivity maps 807 of a posterior coil array based on the set of raw REG sensitivity maps 806. The set of raw REG sensitivity maps 806 may be generated by executing a calibration scan within FOV 830 and projecting the data onto the S/I direction. As the REGs outside of the FOV 830 are similar to the REGs within the FOV (similar in that the REGs may have the same number of coil elements, be spaced apart by an equal manner, etc.), the set of REG sensitivity maps after thresholding and Gaussian fitting replacement may be extrapolated to cover the entire extent 831 of the coil array. In one example, as the relative positions among the coil elements of the posterior array are fixed, the set of REG sensitivity maps may be extrapolated outside of the FOV 830 by shifting the REG sensitivity maps within FOV 830 based on prior knowledge of relative positions between the REGs in the posterior coil array.

FIG. 9 shows an example of selecting REG(s) for the main scan based on the REG sensitivity maps 1001 and the ROI. In some embodiments, REG(s) with an extent of sensitivity overlapping the ROI are first identified. For example, if ROI 1 ranges from P1 to P2 along the S/I direction, the first and the second REGs are identified for ROI 1 because the extents of sensitivity of both REGs overlap ROI 1. As another example, ROI 2 ranges from P2 to P3 along the S/I direction, and overlaps the extents of sensitivity of the first, second, and third REGs. As such, the first, second, and third REGs are identified for ROI 2. In some embodiments, the REGs may be identified further based on the sensitivity values of the REG sensitivity map. For example, REGs with high accumulative sensitivity within the ROI are identified.

In further embodiments, it is determined whether the identified REGs are compatible with each other. The identified REGs might be exclusive of each other. For example, if the first REG consists of all coil elements in the anterior coil array 210 and the second REG consists of coil elements in row 211, the first and second REGs are exclusive of each other because they both include coil elements in row 211. Therefore, in some embodiments, tiebreaker rules may be applied to select one REG from exclusive REGs. For example, if parallel imaging is used, a bigger REG (i.e., first REG) is preferred; while if reduction of phase wrap artifact is preferred, a smaller REG (i.e., second REG) is preferred. In some embodiments, multiple factors are considered in totality and the REG that strikes the best balance is selected from exclusive REGs.

In this way, the sensitivity of each coil element of an RF coil array comprising a plurality of coil elements may be determined from low resolution scan data acquired during a pre-scan (e.g., a calibration scan performed prior to a main imaging scan). The low resolution scan data may be volumetric data that is acquired for each channel of the RF coil array (the channels may be defined by the receive circuitry that transfers MR signals obtained by the coil elements to a control unit for processing; in some embodiments, each coil element may be individually coupled to a respective channel). The low resolution scan data may be projected to one dimension along the coil selection direction. For example, the 3D data for each channel may be projected to one dimension along the superior-inferior direction, thereby generating a plurality of channel sensitivity maps. The channel sensitivity maps may be grouped according to REGs information. For example, a coil array may include six rows of coil elements with five coil elements per row, and each row may be constrained such that all coil elements in a row are activated/tuned together. Such a grouping would result in six REGs, each REG having five coil elements. For a given REG, the channel sensitivity maps corresponding to the five coil elements that make up that REG are combined. The resulting REG sensitivity map then conveys the coverage, along the coil selection direction, of each REG.

The REG sensitivity maps may then be compared to a user-selected imaging ROI. For example, the user-set ROI may have an extent along the coil selection direction. Any REG with an extent of sensitivity that overlaps the ROI may be identified, in some embodiments. Any REG that does not overlap the ROI may be excluded. If the identified REGs include exclusive REGs, one REG is selected from the exclusive REGs according to tiebreaker rules. Coil elements in the selected REGs may then be used for imaging during the main scan and coil elements not in any selected REGs may not be used for imaging during the main scan. In this way, an RF coil array that includes a plurality of coil elements may be used to receive MR signals during a main imaging MR scan, with only a subset (e.g., some but not all) of the coil elements being activated to receive MR signals. One or more images may then be reconstructed from the received MR signals. By receiving MR signals with only a subset of the coil elements, and deactivating the remaining coil elements of the RF coil array, noise that may otherwise be contributed to the image from the coil elements located outside the ROI may be reduced, thus improving image quality.

FIG. 10 is an example subroutine 1000 for displaying the dynamic coil mode. Displaying the dynamic coil mode may include displaying selected REGs of the dynamic coil mode. In some embodiments, the dynamic coil mode may be displayed together with an image of the subject. The dynamic coil mode may be displayed by presenting a visual representation of the extent of each selected REG. In this disclosure, the extent of a REG is used interchangeable with the extent of sensitivity of a REG.

At 1002, image of the subject is displayed. The image may be acquired during the localizer scan at 308 of FIG. 3. Displaying the subject may include displaying an imaging target within the imaging subject. For example, the imaging target may be the heart, the brain, or the hand. In on embodiment, a boundary of the imaging target is identified. For example, the boundary of the imaging target may be determined automatically based on the sensitivity of all coils. The boundary of the imaging target may also be displayed. In another embodiment, the boundary of the subject within the image is displayed. The boundary of the subject may be obtained by thresholding the image.

At 1004, the ROI selected at 312 of FIG. 3 is displayed on top of the image of the subject. Alternatively, the positions of imaging slices within the ROI may be displayed. At 1006, the full extent of the coil array is displayed. At 1008, the extent of REG(s) selected in the dynamic coil mode from the col array is displayed.

At 1010, the mismatch between the ROI and the selected REGs of the dynamic coil mode is indicated, if a mismatch is present. For example, the mismatch may be indicated based on the color of REG extent.

At 1012, the overlap between REGs in the dynamic coil mode is displayed. Subroutine 1000 may also indicate excessive overlap. Details regarding displaying overlap of REGs are presented in FIG. 13.

FIG. 11 and FIG. 12 are examples for displaying a dynamic coil mode based on relative positions among the ROI, the subject (or the imaging target), and the selected REGs in the dynamic coil mode. FIG. 11 and FIG. 12 show two different relative positions between the subject (or the imaging target) and the ROI. Each figure shows three example visual representations of different arrangements of selected REGs.

In FIG. 11, image 1101 of the subject and ROI 1104 may be displayed simultaneously. The image 1101 shows the subject in the sagittal plane. Boundary 1102 of the subject may also be displayed. In some embodiments, boundary 1102 may be the boundary of the imaging target (e.g., the sensible region in the calibration. The ROI 1104 is within the boundary 1102.

Example 1106 displays the extents of two selected REGs. The first REG includes coil elements of, for example, a first anterior coil array. The second REG includes coil elements of, for example, a second anterior coil array. The extent 1112 of the first REG (shown as a solid line) and the extent 1114 of the second REG (shown as a solid line) along the SIT direction may be displayed together with the image 1101 and ROI 1104. Further, the extent 1116 of the first coil array (shown as a dashed line) and the extent 1118 of the second coil array (shown as a dashed line) may also be displayed along the SIT direction. The extent of a coil array is shown as an extension along the extent of REG (e.g., each coil array extent shown in FIG. 11 also extends along the extent of the corresponding REG, but is not visible herein due to the solid line covering the dashed line). The extent of coil array may be displayed in a manner different from the extent of the REG (e.g., different color, dashed line, etc.). Thus, the portion of the coil array that is active for receiving the MR signals may be visualized. In this example, as the extents of the selected REGs matches the ROI (e.g., fully covers the ROI) in the SIT direction, the extents of the REGs may be displayed in a first color or otherwise highlighted to indicate that the dynamic coil mode is an ideal dynamic coil mode.

Example 1108 displays the extent 1120 of one selected REG (in a solid line) in the dynamic coil mode. The REG includes coil elements of, for example, a posterior coil array, or an anterior coil array, or a head-neck coil array. The extent 1120 does not fully cover the ROI in the SIT direction. Since no REG covers the mismatch region 1121 that is within the subject boundary 1102, the extent 1120 of REG may be displayed in a second color or otherwise differentially highlighted to indicate error and/or mismatch in the dynamic coil mode.

Example 1110 displays the extent 1122 of a first selected REG (as a solid line) and the extent 1123 of a second selected REG (as a solid line) of the dynamic coil mode. The first REG includes coil elements of, for example, a first anterior coil array. The second REG includes coil elements of, for example, a second anterior coil array. Similar to example 1106, since there is a mismatch region 1121 between the ROI and the REGs coverage and the mismatch region 1121 is within the subject boundary 1102, the extents 1122 and 1123 of the REGs are displayed in the second color indicating error in the dynamic coil mode.

In FIG. 12, image 1230 of the subject and ROI 1231 may be displayed simultaneously. The image 1230 shows the subject in the sagittal plane. Boundary 1260 of the subject may also be displayed. In another embodiment, boundary 1260 may be the boundary of the imaging target, such as an organ or part of the subject. Part of the ROI 1231 is outside of the boundary 1260. For example, when the brain or extremity of the body is scanned, the operator may select an ROI outside of the boundary 1260.

In example 1232, the two REGs of different coil arrays (e.g., a first anterior coil array and a second anterior coil array) are used for imaging the ROI according to the dynamic coil mode, similar to the example 1206 of FIG. 11. The extent 1235 of the first REG (shown as a solid line) and the extent 1241 of the second REG (shown as a solid line) along the SIT direction are displayed together with the image 1230 and the ROI 1231. Further, the extent 1236 of the first coil array (shown as a dashed line) and the extent 1242 of the second coil array (shown as a dashed line) are displayed in a manner different from the extent of REG (e.g., different color, dashed line, etc.). (Each coil array extent shown in FIG. 12 also extends along the extent of the corresponding REG, but is not visible herein due to the solid line covering the dashed line.) Though coverage of the first and the second REGs and the ROI 1231 has a mismatched region 1250, the mismatched region 1250 is outside of boundary 1260, thus does not affect scanning the imaging subject or the imaging target within the ROI 1231. Therefore, the extents 1235 and 1241 are displayed in the first color indicating an ideal dynamic coil mode.

In example 1233, the one REG is selected according to the dynamic coil mode. As the extent 1237 of the REG (shown as a solid line) does not cover the full extent of the imaging subject within the ROI, the extent 1237 may be shown in a second color indicating error in dynamic coil mode.

In example 1234, two REGs from two coil arrays are selected according to the dynamic coil mode. Extent 1238 of the first REG (shown as a solid line) overlaps with the extent 1239 of the second REG (shown as a solid line) in the SIT direction. The portion of coil array with coil elements not selected by the dynamic coil mode can be visualized in coil array extent 1240 (shown as a dashed line). As the REG extents 1238 and 1239 do not cover the imaging subject within ROI 1231 in the SIT direction, the REG extents may be shown in the second color indicating error in dynamic coil mode.

FIG. 13 is an example visual representation of the dynamic coil mode displayed with image 1302 of the imaging subject acquired from localizer scan. The image 1302 shows the subject in the sagittal plane. Extent 1304 of a first REG and extent 1306 of a second REG are shown on left side of the image 1302. The first REG includes coil elements of, for example, the first anterior coil array. The second REG includes coil elements of, for example, the second anterior coil array. The extent 1308 of a third REG is shown on the right side of the image 1302 relative to the subject. The third REG is from, for example, the posterior array, and is selected according to the dynamic coil mode. Instead of illustrating the boundary of ROI in FIG. 11 and FIG. 12, lines 1310 in the posterior-anterior direction show position of the slices for the main scan. Overlapped area 1307 between extent 1304 and 1306 is displayed on top of the image 1302. For example, the overlapped area may be displayed by shading the area with a color. In one embodiment, if the extent of the overlapped area along the extent of the REG exceeds a predetermined threshold value, the overlapped area may be shaded with a second color indicating excessive overlap between the REGs in the dynamic coil mode. Excessive overlap between the REGs may lead to higher noise level. Responsive to excessive overlap, the operator may re-adjust the coil array position to reduce the overlapped area between REGs. In this way, signal to noise level of the received MR signals may be increased. Alternatively, the operator may command to proceed with the main scan with the current REG position. The REG extents 1304 and 1306 may also be displayed in the second color indicating error in the REG selection of the anterior coil array. If the extent of the overlapped area is less or equal to the threshold value, the extents of 1304 and 1306 may be shaded with a first color indicating proper overlap between the REGs. As the extent 1308 fully covers the ROI, the extent 1308 is displayed in the first color indicating proper REG selection of the posterior coil array.

The technical effect of selecting the portions of the coil arrays (such as one or more REGs of the coil arrays) for scanning based on the REG sensitivity map is that high signal to noise ratio may be achieved and image quality can be improved. Further, the Mill system may automatically select the coil arrays with no input from the operator. The technical effect of displaying the dynamic coil mode is that the REG position and the overlap between the REGs may be easily visualized by the operator, and enables the operator to adjust the coil array position prior to the main scan. The technical effect of determining the dynamic coil mode of different ROIs based on results of one calibration scan whether the center of the ROI is fixed is that the total imaging time can be reduced.

In one embodiment, a method for magnetic resonance imaging (MRI) with a radio frequency (RF) coil array comprising a plurality of coil elements includes grouping the plurality of coil elements into receive elements groups (REGs) according to REGs information; generating channel sensitivity maps for the plurality of coil elements; generating REG sensitivity maps based on the REGs information and the channel sensitivity maps; selecting one or more REGs based on the REG sensitivity maps and a region of interest (ROI); and scanning the ROI with the coil elements in the one or more selected REGs being activated and the coil elements not in any selected REGs being deactivated. In a first example of the method, scanning the ROI with the coil elements in the one or more selected REGs being activated comprises scanning the ROI with the coil elements of the one or more selected REGs being activated during a higher resolution scan, and wherein generating channel sensitivity maps for the plurality of coil elements comprise generating channel sensitivity maps for the plurality of coil elements based on data acquired from a lower resolution calibration scan. A second example of the method optionally includes the first example and further includes wherein the data acquired from the lower resolution calibration scan comprises a 3D dataset acquired via each channel of the plurality of channels, and wherein generating the plurality of channel sensitivity maps comprises, for a given channel, projecting the 3D dataset acquired over a corresponding channel along a coil selection direction and wherein, for a given channel, the corresponding channel sensitivity map represents the sensitivity of the coil element that is coupled to the given channel. A third example of the method optionally includes one or more of the first and second examples, and further includes wherein the REG sensitivity maps represent respective sensitivities of a plurality of REGs. A fourth example of the method optionally includes one or more or each of the first through third examples, and further includes, wherein generating the REG sensitivity maps includes, for a given REG, combining channel sensitivity maps of each channel in the given REG. A fifth example of the method optionally includes one or more or each of the first through fourth examples, and further includes, wherein selecting one or more REGs based on the REG sensitivity maps and the ROI comprises: selecting one or more REGs that have an extent of sensitivity along the coil selection direction that overlaps the ROI; and wherein scanning the ROI with the coil elements in the one or more selected REGs being activated comprises obtaining MR signals from each coil element of each of the selected one or more REGs. A sixth example of the method optionally includes one or more or each of the first through fifth examples, and further includes, wherein scanning the ROI with the coil elements on the one or more selected REGs being activated and the coil elements not in any selected REG being deactivated comprises excluding one or more REGs that do not have an extent of sensitivity that overlaps the ROI. A seventh example of the method optionally includes one or more or each of the first through sixth examples, and further includes, displaying a visual representation of an overlapped region between the extents of two or more of the selected REGs. An eighth example of the method optionally includes one or more or each of the first through seventh examples, and further includes, outputting a notification to a user indicating the extent of the selected one or more selected REGs does not cover the ROI. A ninth example of the method optionally includes one or more of the first through eighth examples, and further includes, displaying a visual representation of the extent of each of the selected REGs and an extent of the RF coil array.

In another representation, a method for magnetic resonance imaging (MRI) with a radio frequency (RF) coil array comprising a plurality of coil elements includes obtaining magnetic resonance (MR) signals from one or more selected coil elements of the RF coil array, the one or more selected coil elements selected based on: a sensitivity of at least one of the coil elements along a coil selection direction, determined from a projection of a previous scan; and a region of interest (ROI); and reconstructing an image from the obtained MR signals. In a first example of the method, the MR signals are obtained during a higher resolution scan, and the previous scan is a lower resolution calibration scan, and wherein each coil element of the RF coil array is coupled to a controller unit via a channel of a plurality of channels, and further comprising determining the sensitivity of each of the coil elements, and generating, from data acquired from the calibration scan, a plurality of channel sensitivity maps each corresponding to a respective channel, and wherein, for a given channel, the corresponding channel sensitivity map represents the sensitivity of the coil element that is coupled to the given channel. A second example of the method optionally includes the first example and further includes wherein the data acquired from the calibration scan comprises a 3D dataset acquired via each channel, and wherein generating the plurality of channel sensitivity maps comprises, for a given channel, projecting the 3D dataset acquired over a corresponding channel along the coil selection direction. A third example of the method optionally includes one or more of the first and second examples, and further includes generating a receive element group (REG) sensitivity map from the plurality of channel sensitivity maps, the REG sensitivity map representing respective sensitivities of a plurality of REGs, and wherein each REG comprises a subset of coil elements of the plurality of coil elements. A fourth example of the method optionally includes one or more of the first through third examples, and further includes, wherein generating the REG sensitivity map includes, for a given REG, combining channel sensitivity maps of each channel associated with the given REG. A fifth example of the method optionally includes one or more of the first through fourth examples, and further includes, wherein the one or more selected coil elements being selected based on the sensitivity of each coil element determined from the projection of the low resolution scan data and the ROI comprises: selecting one or more REGs that have an extent along the coil selection direction that overlaps the ROI; and wherein obtaining MR signals from one or more selected coil elements of the RF coil array comprises obtaining MR signals from each coil element of each of the selected one or more REGs. A sixth example of the method optionally includes one or more of the first through fifth examples, and further includes, excluding one or more REGs that do not have the extent that overlaps the imaging position and, while obtaining the MR signals from the one or more selected coil elements, not obtaining the MR signals from any coil element of the excluded one or more REGs. A seventh example of the method optionally includes one or more of the first through sixth examples, and further includes, displaying a visual representation of an overlapped region between the extents of two or more of the selected one or more REGs. A eighth example of the method optionally includes one or more of the first through seventh examples, and further includes, outputting a notification to a user indicating the extent of the one or more selected REGs not covering the ROI. A ninth example of the method optionally includes one or more of the first through eighth examples, and further includes, displaying a visual representation of the extent of each of the selected REGs and an extent of the RF coil array.

In another embodiment, a method for magnetic resonance imaging (MRI) with a receive radio frequency (RF) coil array comprising a plurality of coil elements includes acquiring a dataset from each coil element of the RF coil array during a calibration scan, each coil element coupled to a controller unit via a channel of a plurality of channels, and the plurality of coil elements are grouped into a plurality of receive element groups (REGs); generating a one-dimensional channel sensitivity map for each channel of the plurality of channels by projecting the acquired dataset to a coil selection direction; generating a receive element group (REG) sensitivity map representing sensitivities of the REGs based on the channel sensitivity maps of the channels; scanning a first region of interest (ROI) of a subject with a first collection of REGs selected from the plurality of REGs based on the REG sensitivity map; and after scanning the first ROI, scanning a second, different, ROI with a second collection of REGs selected from the plurality of REGs based on the REG sensitivity map, a center of the first ROI within a threshold distance from a center of the second ROI. In a first example of the method, the first collection of REGs and the second collection of REGs include different REGs. A second example of the method optionally includes the first example and further includes, wherein the first collection of REGs and the second collection of REGs are the same. A third example of the method optionally includes one or more of the first and second examples, and further includes, wherein no calibration scan is performed between scanning the first ROI and scanning the second ROI. A fourth example of the method optionally includes one or more or each of the first through third examples, and further includes, wherein the first ROI and the second ROI are within a field of view selected by an operator. A fifth example of the method optionally includes one or more or each of the first through fourth examples, and further includes, wherein the second ROI is rotated relative to the first ROI with respect to the center of the first ROI.

In yet another embodiment, a magnetic resonance imaging (MRI) apparatus comprises a controller unit; one or more coil arrays, each coil array includes a plurality of coil elements, and each coil element is coupled to the controller unit via a channel of a plurality of channels; a display unit; and a memory storing receive elements groups (REGs) information for grouping the plurality of coil elements of the one or more coil arrays and executable instructions that when executed cause the controller unit to: generate channel sensitivity maps for the plurality of coil elements; generate REG sensitivity maps based on the REGs information and the channel sensitivity maps; select one or more REGs based on the REG sensitivity maps and a region of interest (ROI); obtain magnetic resonance (MR) signals the coil elements in the one or more selected REGs of the RF coil array but not from the coil elements not in any selected REGs; display a visual presentation of the one or more selected REGs; and reconstruct an image from the obtained MR signals. In a first example of the apparatus, wherein displaying the one or more selected REGs includes displaying an extent of sensitivity of each of the one or more selected REGs including a subset of the one or more selected coil elements. A second example of the apparatus optionally includes the first example and further includes, wherein the MR signals are obtained in a first higher resolution cardiac scan, and the previous scan is a lower resolution scan, and further comprising instructions to: receive selection of a second ROI after reconstructing the image; and responsive to the second ROI having a geometric center within a threshold distance from a geometric center of first ROI and one or more corners of the second ROI different from the corners of the first ROI, reconstruct a second image with MR signals obtained from the selected one or more REGs. A third example of the method optionally includes one or more of the first and second examples, and further includes instructions to:

responsive to the geometric center of the second ROI outside of the threshold distance from the geometric center of the first ROI, reconstruct a second image with MR signals received from a second REG different from the one or more selected REGs.

In another representation, a magnetic resonance imaging (MRI) apparatus comprises a controller unit; one or more coil arrays, each coil array including a plurality of coil elements, and each coil element is coupled to the controller unit via a channel of a plurality of channels; a display unit; and a memory storing executable instructions that when executed cause the controller unit to: obtain magnetic resonance (MR) signals from one or more selected coil elements of the RF coil array, the one or more selected coil elements selected based on: a sensitivity of at least one of the coil elements along a coil selection direction determined from a projection of previous scan; and a first region of interest (ROI); display a visual presentation of the one or more selected coil elements; and reconstruct an image from the obtained MR signals. In a first example of the apparatus, the plurality of coil elements of each coil array are grouped into one or more receive element groups (REGs), and wherein display the one or more selected coil elements includes display an extent of each of the REG including a subset of the one or more selected coil elements. A second example of the apparatus optionally includes the first example and further includes, wherein the MR signals are obtained in a first higher resolution scan, and the previous scan is a lower resolution scan, and further comprising instructions to: receive selection of a second ROI after reconstruct the image; and responsive to the second ROI having the a geometric center within a threshold distance from a geometric center of first ROI and one or more corners of the second ROI different from the corners of the first ROI, reconstruct a second image with MR signals obtained from the selected one or more coil elements. A third example of the method optionally includes one or more of the first and second examples, and further includes instructions to: responsive to the geometric center of the second ROI outside of the threshold distance from the geometric center of the first ROI, reconstruct a second image with MR signals received from the coil elements different from the one or more selected coil elements.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:
1. A method for magnetic resonance imaging (MRI) with a radio frequency (RF) coil array comprising a plurality of coil elements, the method comprising;
 grouping the plurality of coil elements into receive elements groups (REGs) according to REGs information;
 generating a channel sensitivity map for each coil element of the plurality of coil elements based on a plurality of 3D datasets each acquired via a respective channel of a plurality of channels during a lower resolution calibration scan, the generating including, for a given channel, projecting the 3D dataset acquired over that channel along a coil selection direction;
 generating REG sensitivity maps based on the REGs information and the channel sensitivity maps;
 selecting one or more REGs based on the REG sensitivity maps and a region of interest (ROI);
 upon selecting the one or more REGs, scanning the ROI with the coil elements in the one or more selected REGs being activated and the coil elements not in any selected REGs being deactivated; and
 reconstructing one or more images from data acquired with the activated coil elements during the scanning.

2. The method of claim 1, wherein scanning the ROI with the coil elements in the one or more selected REGs being activated comprises scanning the ROI with the coil elements of the one or more selected REGs being activated during a higher resolution scan.

3. The method of claim 2, wherein, for a given channel, the corresponding channel sensitivity map represents the sensitivity of the coil element that is coupled to the given channel.

4. The method of claim 3, wherein the REG sensitivity maps represent respective sensitivities of a plurality of REGs.

5. The method of claim 4, wherein generating the REG sensitivity maps includes, for a given REG, combining channel sensitivity maps of each channel in the given REG.

6. The method of claim 4, wherein selecting one or more REGs based on the REG sensitivity maps and the ROI comprises:
 selecting one or more REGs that have an extent of sensitivity along the coil selection direction that overlaps the ROI; and
 wherein scanning the ROI with the coil elements in the one or more selected REGs being activated comprises obtaining MR signals from each coil element of each of the selected REGs.

7. The method of claim 6, wherein scanning the ROI with the coil elements on the one or more selected REGs being activated and the coil elements not in any selected REG being deactivated comprises excluding one or more REGs that do not have an extent of sensitivity that overlaps the ROI.

8. The method of claim 6, further comprising displaying a visual representation of an overlapped region between the extents of two or more of the selected REGs.

9. The method of claim 6, further comprising outputting a notification to a user indicating an extent of the selected one or more REGs does not cover the ROI.

10. The method of claim 6, further comprising displaying a visual representation of the extent of each of the selected REGs and an extent of the RF coil array.

11. A method for magnetic resonance imaging (MRI) with a receive radio frequency (RF) coil array comprising a plurality of coil elements, the method comprising:
- acquiring a dataset from each coil element of the RF coil array during a calibration scan, each coil element coupled to a controller unit via a respective channel of a plurality of channels, and the plurality of coil elements are grouped into a plurality of receive element groups (REGs);
- generating a one-dimensional channel sensitivity map for each channel of the plurality of channels by projecting the acquired dataset to a coil selection direction;
- generating a receive element group (REG) sensitivity map representing sensitivities of the REGs based on the channel sensitivity maps of the channels;
- scanning a first region of interest (ROI) of a subject with a first collection of REGs selected from the plurality of REGs based on the REG sensitivity map;
- after scanning the first ROI, scanning a second, different, ROI with a second collection of REGs selected from the plurality of REGs based on the REG sensitivity map, a center of the first ROI within a threshold distance from a center of the second ROI; and
- reconstructing one or more images from data acquired with the first collection of REGs during the scanning of the first ROI and/or reconstructing one or more images from data acquired with the second collection of REGs during the scanning of the second ROI.

12. The method of claim 11, wherein the first collection of REGs and the second collection of REGs include different REGs.

13. The method of claim 12, wherein the first collection of REGs and the second collection of REGs are the same.

14. The method of claim 13, wherein no calibration scan is performed between scanning the first ROI and scanning the second ROI.

15. The method of claim 11, wherein the first ROI and the second ROI are within a field of view selected by an operator.

16. The method of claim 11, wherein the second ROI is rotated relative to the first ROI with respect to the center of the first ROI.

17. A magnetic resonance imaging (MRI) apparatus, comprising:
- a controller unit;
- one or more coil arrays, each coil array includes a plurality of coil elements, and each coil element is coupled to the controller unit via a respective channel of a plurality of channels;
- a display unit; and
- a memory storing receive elements groups (REGs) information for grouping the plurality of coil elements of the one or more coil arrays and executable instructions that, when executed, cause the controller unit to:
- generate a channel sensitivity map for each coil element of the plurality of coil elements;
- generate REG sensitivity maps based on the REGs information and the channel sensitivity maps;
- select one or more REGs based on the REG sensitivity maps and a region of interest (ROI);
- upon selecting the one or more REGs, obtain magnetic resonance (MR) signals from the coil elements in the one or more selected REGs of the RF coil array but not from the coil elements not in any selected REGs;
- display a visual presentation of the one or more selected REGs; and
- reconstruct an image from the obtained MR signals.

18. The MRI apparatus of claim 17, wherein displaying the one or more selected REGs includes displaying an extent of sensitivity of each of the one or more selected REGs including a subset of the one or more selected coil elements.

19. The MRI apparatus of claim 17, wherein the MR signals are obtained in a first scan different than the previous scan, and further comprising instructions to:
- receive selection of a second ROI after reconstructing the image; and
- responsive to the second ROI having a geometric center within a threshold distance from a geometric center of first ROI and one or more corners of the second ROI different from the corners of the first ROI, reconstruct a second image with MR signals obtained from the selected one or more REGs.

20. The MRI apparatus of claim 19, further comprising instructions to:
- responsive to the geometric center of the second ROI outside of the threshold distance from the geometric center of the first ROI, reconstruct a second image with MR signals received from a second REG different from the one or more selected REGs.

* * * * *